(12) United States Patent
Huang

(10) Patent No.: US 11,489,060 B2
(45) Date of Patent: Nov. 1, 2022

(54) SEMICONDUCTOR DEVICE WITH GATE SPACER AND MANUFACTURING METHOD OF THE SEMICONDUCTOR DEVICE

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/169,911

(22) Filed: Feb. 8, 2021

(65) Prior Publication Data
US 2022/0254898 A1  Aug. 11, 2022

(51) Int. Cl.
| H01L 21/70 | (2006.01) |
| H01L 29/49 | (2006.01) |
| H01L 21/764 | (2006.01) |
| H01L 21/28 | (2006.01) |
| H01L 29/417 | (2006.01) |

(52) U.S. Cl.
CPC .... H01L 29/4991 (2013.01); H01L 21/28123 (2013.01); H01L 21/764 (2013.01); H01L 29/41725 (2013.01)

(58) Field of Classification Search
CPC ... H01L 29/49; H01L 29/417; H01L 29/4991; H01L 29/41725; H01L 29/6653; H01L 29/6656; H01L 29/66553; H01L 29/66689; H01L 29/66719; H01L 29/515; H01L 29/0649; H01L 21/28; H01L 21/764; H01L 21/7682; H01L 21/76264; H01L 21/76289; H01L 21/28123
USPC .......................................... 257/382
See application file for complete search history.

(56) References Cited

U.S. PATENT DOCUMENTS

| 5,656,852 A * | 8/1997 | Nishioka | H01L 29/516 257/632 |
| 2015/0255571 A1* | 9/2015 | Xu | H01L 29/66545 257/288 |
| 2016/0118247 A1* | 4/2016 | Park | H01L 21/02247 438/762 |
| 2019/0157133 A1* | 5/2019 | Lee | H01L 21/7682 |

* cited by examiner

*Primary Examiner* — Chuong A Luu
(74) *Attorney, Agent, or Firm* — Muncy, Geissler, Olds & Lowe, P.C.

(57) ABSTRACT

The present application provides a semiconductor device with an air gate spacer for reducing parasitic capacitance and a method for manufacturing the semiconductor device. The semiconductor device includes a stacking structure, a first sidewall spacer and a second sidewall spacer. The stacking structure stands on a semiconductor substrate. The first and second sidewall spacers cover a sidewall of the stacking structure. An air gap is sealed between the first and second sidewall spacers. A top end of the air gap is substantially aligned with top ends of the first and second sidewall spacers. A top portion of the air gap is tapered toward a top end of the air gap.

11 Claims, 21 Drawing Sheets

SEMICONDUCTOR DEVICE WITH GATE SPACER AND MANUFACTURING METHOD OF THE SEMICONDUCTOR DEVICE

TECHNICAL FIELD

The present disclosure relates to a semiconductor device and a manufacturing method thereof, and more particularly, to a semiconductor device with an air gate spacer for reducing parasitic capacitance and a manufacturing method of the semiconductor device.

DISCUSSION OF THE BACKGROUND

The semiconductor industry has experienced rapid growth in the past decades. Along with advances in material and manufacturing techniques, progress of integrated circuit during the past decades also includes continuously scaling of feature size. Such scaling improves on-current and switching speed of transistors in the integrated circuit, hence reduces logic delay of the integrated circuit. However, the scaling is undesirably accompanied by increase of resistance and parasitic capacitance of metal lines in the integrated circuit. As a result, interconnection delay of the integrated circuit is increased.

SUMMARY

In an aspect of the present disclosure, a semiconductor device is provided. The semiconductor device comprises: a stacking structure, standing on a semiconductor substrate; and a first sidewall spacer and a second sidewall spacer, covering a sidewall of the stacking structure, wherein an air gap is sealed between the first and second sidewall spacers, a top end of the air gap is substantially aligned with top ends of the first and second sidewall spacers, and a top portion of the air gap is tapered toward a top end of the air gap.

In another aspect of the present disclosure, a manufacturing method of a semiconductor device is provided. The method comprises: forming a stacking structure on a semiconductor substrate; forming a first sidewall spacer, a second sidewall spacer and a sacrificial sidewall spacer on a sidewall of the stacking structure, wherein the sacrificial sidewall spacer is located between the first and second sidewall spacers, and the first and second sidewall spacers have an etching selectivity with respect to the sacrificial sidewall spacer; and removing the sacrificial sidewall spacer to form an air gap between the first and second sidewall spacers.

In yet another aspect of the present disclosure, a manufacturing method of a semiconductor device is provided. The method comprises: forming a stacking structure on a semiconductor substrate; forming a first sidewall spacer, a second sidewall spacer and a sacrificial sidewall spacer on a sidewall of the stacking structure, wherein the sacrificial sidewall spacer is located between the first and second sidewall spacers, and the sacrificial sidewall spacer is formed of an energy removable material (ERM); and providing an energy to the sacrificial sidewall spacer, such that the sacrificial sidewall spacer decomposes to form an air gap and a liner layer enclosing the air gap.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
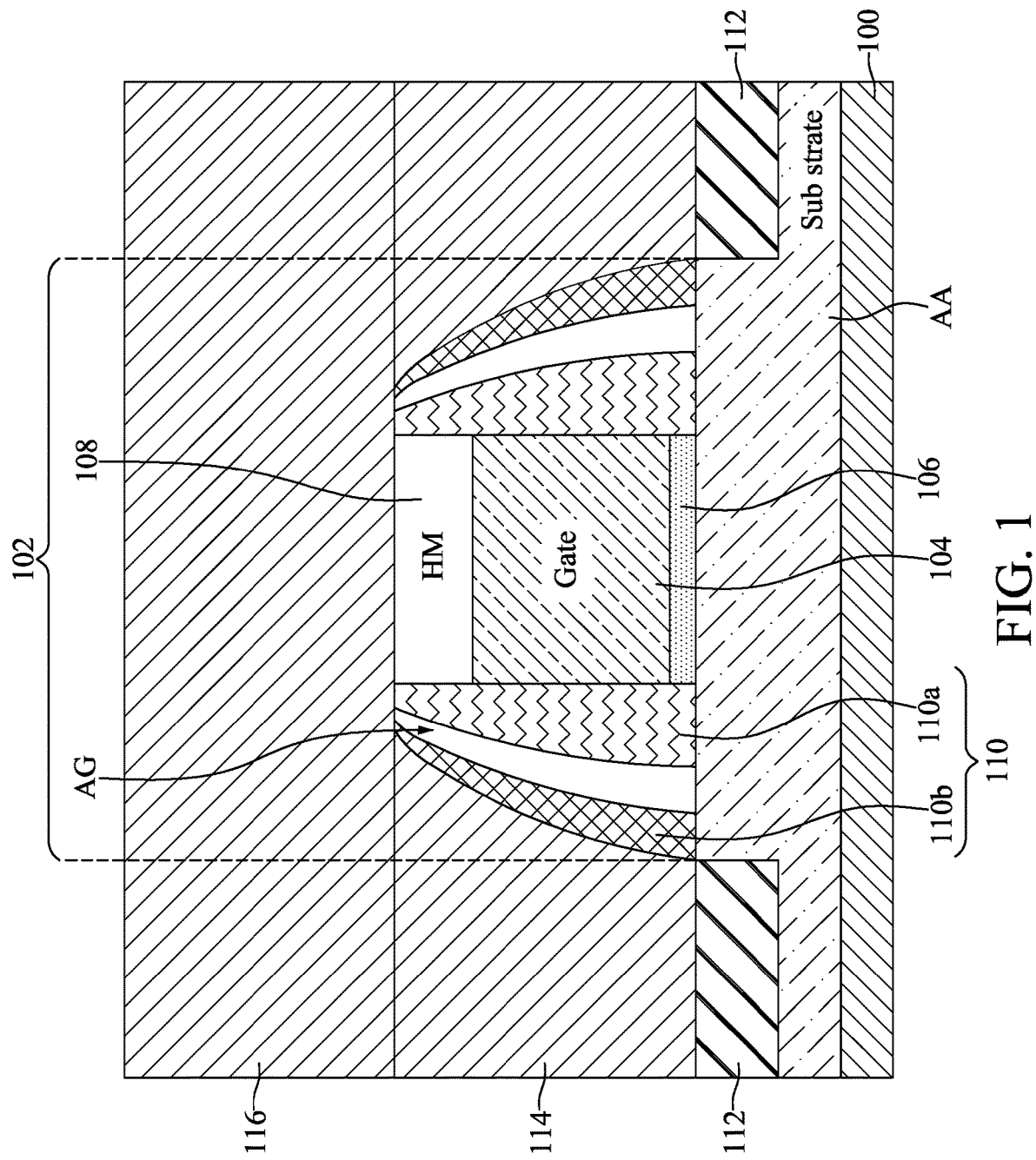
FIG. 1 is a schematic cross-sectional view illustrating a semiconductor device according to some embodiments of the present application.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view illustrating a semiconductor device 10 according to some embodiments of the present application.

Referring to FIG. 1, the semiconductor device 10 includes a gate structure 102 standing on a semiconductor substrate 100. The semiconductor substrate 100 may be a semiconductor wafer or a semiconductor-on-insulator (SOI) wafer. For instance, the semiconductor substrate 100 may be a silicon wafer or a silicon-on-insulator wafer. Further, the gate structure 102 may be part of a field effect transistor (FET), and may stand on an active area AA of the semiconductor substrate 100. The active area AA may be a doped region extending into the semiconductor substrate 100 from a top surface of the semiconductor substrate 100. Although not shown in FIG. 1A, the active area AA may be laterally surrounded by an isolation structure, which may be similar to an isolation structure 202 to be described with reference to FIG. 2. The active area AA may have a second conductive type when the FET is a first conductive type FET. The first conductive type is complementary to the second conductive type. For instance, the first conductive type is N-type while the second conductive type is P-type, or vice versa.

The gate structure 102 includes a gate electrode 104 and a gate dielectric layer 106. The gate electrode 104 is disposed on the active area AA spanning in a shallow region of the semiconductor substrate 100. The gate dielectric layer 106 lies between the gate electrode 104 and the semiconductor substrate 100, such that the gate electrode 104 can be capacitively coupled to the active area AA through the gate dielectric layer 106. Although not shown, the gate electrode 104 may be formed as a line pattern, and the gate dielectric layer 106 extends along with a bottom surface of the overlying gate electrode 104. The gate electrode 104 is formed of a conductive material, while the gate dielectric layer 106 is formed of a dielectric material. In some embodiments, the gate electrode 104 is formed of polysilicon, and the gate dielectric layer 106 is formed of silicon oxide. In alternative embodiments, the gate electrode 104 is formed of a metallic material, while the gate dielectric layer 106 is formed of a high-k dielectric material (e.g., a dielectric material having dielectric constant greater than 3.9 or 7). For instance, the metallic material may include tungsten, titanium, titanium nitride, aluminum or combinations thereof, and the high-k dielectric material may include hafnium oxide, hafnium aluminum oxide, hafnium silicate, tantalum oxide, aluminum oxide, zirconium oxide, the like or combinations thereof.

In some embodiments, the gate structure 102 further includes a hard mask 108. The hard mask 108 is disposed on the gate electrode 104. In some embodiments, the hard mask 108 is functioned as a shadow mask during one or more etching process(es) for forming the gate electrode 104 and the gate dielectric layer 106. In these embodiments, the hard mask 108 extends along a top surface of the gate electrode 104, and sidewalls of the hard mask 108 may be substantially coplanar with sidewalls of the gate electrode 104 and the gate dielectric layer 106. In order to be functioned as the shadow mask, the hard mask 108 may be formed of a material having sufficient etching selectivity with respect to the gate electrode 104 and the gate dielectric layer 106. Alternatively, the hard mask 108 may be at least partially consumed during the etching process for forming the gate dielectric layer 106, and the material of the hard mask 108 may have less or no etching selectivity with respect to the gate dielectric layer 106. In some embodiments, the hard mask 108 is formed of an insulating material, such as silicon oxide, silicon nitride, silicon oxynitride, silicon carbide, the like or combinations thereof.

The gate structure 102 further includes multiple sidewall spacers 110 covering the sidewalls of the gate electrode 104. In those embodiments where the gate electrode 104 is formed in a line shape, each of the sidewall spacers 110 may include portions at opposite sides of the gate electrode 104. Further, in those embodiments where the gate electrode 104 is covered by the hard mask 108, the sidewall spacers 110 may further cover sidewalls of the hard mask 108. Moreover, in some embodiments, the sidewall spacers 110 further cover sidewalls of the gate dielectric layer 106 lying under the gate electrode 104.

The sidewall spacers 110 may include a first sidewall spacer 110a and a second sidewall spacer 110b. The sidewall spacer 110a is located between the second sidewall spacer 110b and a stacking structure including the gate electrode 104 (and the hard mask 108 and/or the gate dielectric layer 106). An air gap AG is sealed between the first sidewall spacer 110a and the second sidewall spacer 110b. Specifically, a sidewall of the first sidewall spacer 110a facing away from the gate electrode 104 defines a side boundary of the air gap AG, and a sidewall of the second sidewall spacer 110b facing toward the gate electrode 104 defines another side boundary of the air gap AG. Top surfaces of portions of the semiconductor substrate 100 between the first and second sidewall spacers 110a, 110b may define bottom boundaries of the air gaps AG. In addition, top ends of the air gaps AG may be substantially aligned with top ends of the first and second sidewall spacers 110a, 110b. Moreover, in some embodiments, a top end of the air gap AG is defined by a dielectric layer (e.g., the dielectric layer 116 as will be further described) lying above the gate structure 102. In those embodiments where each sidewall spacer 110a/110b has portions at opposite sides of the gate electrode 104, the air gap AG may have portions at opposite sides of the gate electrode 104 as well.

The air gap AG is structurally similar to a sidewall spacer (e.g., the first sidewall spacer 110a or the second sidewall spacer 110b) in terms of shape, and may be also referred as an air sidewall spacer or an air gate spacer. In some embodiments, a top portion of each sidewall spacer (i.e., the first sidewall spacer 110a or the second sidewall spacer 110b) is tapered toward its top end. In other words, a lateral width of each sidewall spacer (i.e., the first sidewall spacer 110a or the second sidewall spacer 110b) may decrease toward the top end of each sidewall spacer. In these embodiments, a top portion of the air gap AG may also taper toward a top end of the air gap AG, and a lateral width of the air gap AG may decrease toward the top end of the air gap AG.

The first sidewall spacer 110a and the second sidewall spacer 110b may respectively be formed of an insulating material. In some embodiments, the insulating material is a carbon-containing insulating material. The carbon-containing insulating material may include high density carbon (HDC), silicon carbide (SiC), silicon carbonitride (SiCN) or the like. For instance, the first sidewall spacer 110a may be formed of HDC or SiC, while the second sidewall spacer 110b may be formed of HDC, SiC or SiCN.

The semiconductor device 10 further includes a pair of source/drain structures 112 located at opposite sides of the gate structure 102. The source/drain structures 112 have the same conductive type, which may be complementary to the conductive type of the active area AA. For instance, the source/drain structures 112 have the first conductive type (e.g., N-type) while the active area AA has the second conductive type (e.g., P-type). As another example, the source/drain structures 112 have the second conductive type (e.g., P-type) while the active area AA has the first conductive type (e.g., N-type). In some embodiments, the source/drain structures 112 are doped regions formed in the active area AA of the semiconductor substrate 100. In these embodiments, the source/drain structures 112 may or may not extend to a region of the active area AA below the sidewall spacers 110. In alternative embodiments, the source/drain structures 112 are epitaxial structures formed in recesses at a top surface of the semiconductor substrate 100. In these alternative embodiments, the source/drain structures 112 may or may not protrude from the top surface of the semiconductor substrate 100.

In some embodiments, multiple dielectric layers are stacked on the semiconductor substrate 100. For instance, the dielectric layers may include a dielectric layer 114 laterally surrounding the gate structure 102, and a dielectric layer 116 lying on the dielectric layer 114. A top surface of the dielectric layer 114 may be substantially aligned with the top ends of the sidewall spacers 110 of the gate structure 102. Accordingly, the top surface of the dielectric layer 114 may also be substantially aligned with the top end of the air gap AG sealed between adjacent sidewall spacers 110 (e.g., the first and second sidewall spacers 110a, 110b). In those embodiments where the gate structure 102 includes the hard mask 108, the top surface of the dielectric layer 116 may be substantially aligned with a top surface of the hard mask 108. In addition, the dielectric layer 116 lying on the dielectric layer 114 covers the gate structure 102, and may in contact with the top ends of the sidewall spacers 110. In those embodiments where the top portions of each sidewall spacer 110 is tapered toward its top end, the air gap AG defined between adjacent sidewall spacers 110 may also have a tapered top portion. Consequently, the top end of the air gap AG is rather narrow, and the dielectric layer 116 may barely fill into the air gap AG through the narrow top end of the air gap AG. Therefore, the narrow top end of the air gap AG can be sealed by the dielectric layer 116. The dielectric layers 114, 116 may be respectively formed of a dielectric material. For instance, the dielectric material may include silicon oxide, silicon nitride, silicon carbonitride, silicon boron nitride (SiBN), silicon oxycarbonitride (SiOCN), silicon oxynitride, silicon oxycarbide, silicon carbide, the like or combinations thereof.

As described above, the air gap AG is sealed between adjacent ones of the sidewall spacers 110 covering opposite sidewalls of the gate electrode 104. A dielectric constant of air is approximately that of vacuum, which may be the lowest dielectric constant for a material. Therefore, a parasitic capacitance between the gate electrode 104 and a possible conductive component aside the gate electrode 104 (e.g., a contact plug similar to the contact plug 204 as will be described with reference to FIG. 2) can be reduced as a result of the air gap AG sealed between adjacent ones of the sidewall spacers 110. Consequently, resistance-capacitance (RC) delay on signal transmission through the gate electrode 104 and the possible electrical component aside the gate electrode 104 can be effectively minimized.

Figure 2:
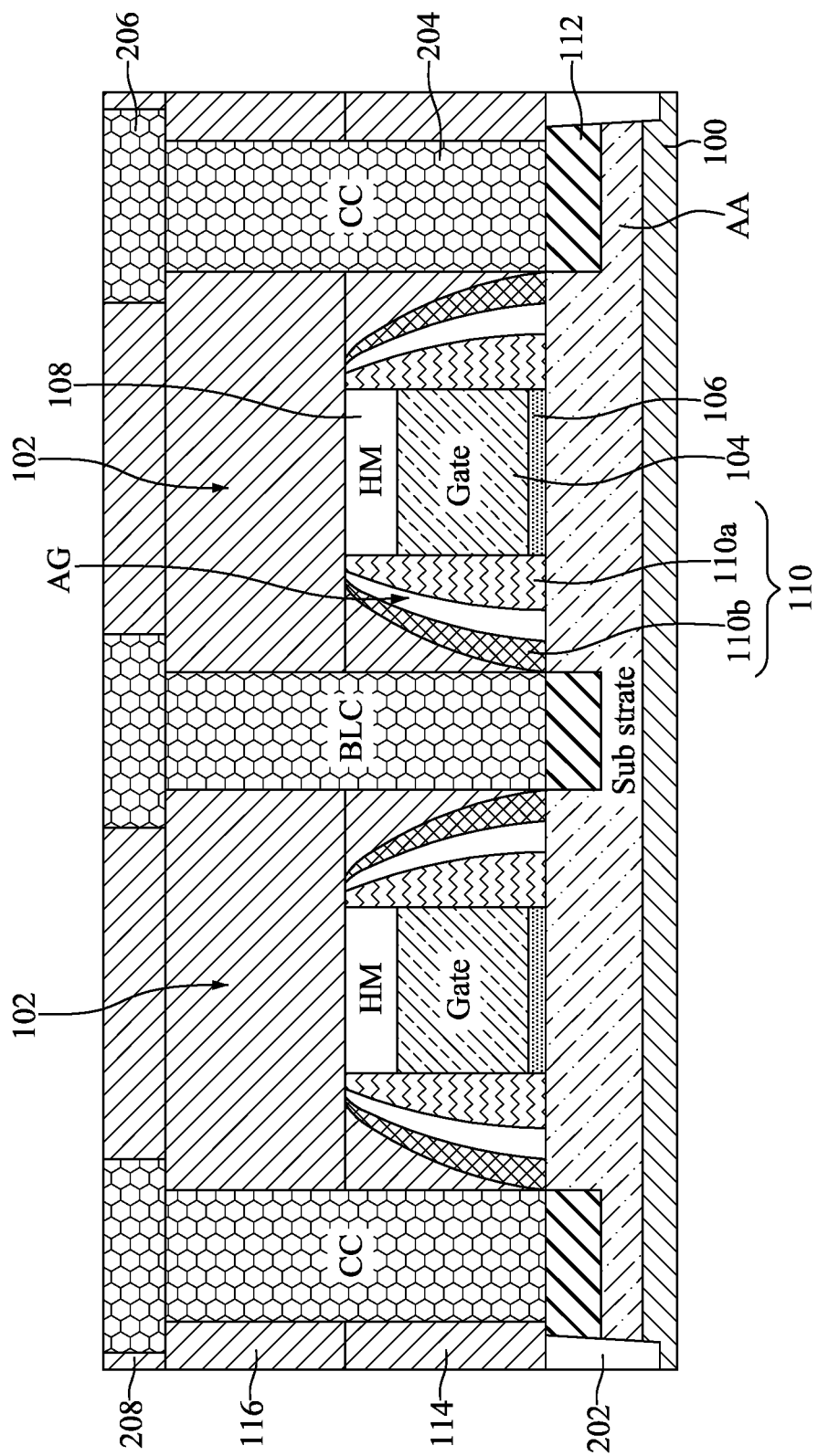
FIG. 2 is a schematic cross-sectional view illustrating a semiconductor device according to some embodiments of the present disclosure.

FIG. 2 is a schematic cross-sectional view illustrating a semiconductor device 20 according to some embodiments of the present disclosure. The semiconductor device 20 to be described with reference to FIG. 2 is similar to the semiconductor device 10 described with reference to FIG. 1. Only differences between the semiconductor devices 10, 20 will be described, the same or the like parts would not be repeated again. Further, the same or similar elements in the semiconductor devices 10, 20 may be labeled with same numeral references.

Referring to FIG. 2, the semiconductor device 20 may be a unit cell in a memory device. In some embodiments, the memory device is a dynamic random access memory (DRAM) device. In these embodiments, each unit cell (i.e., the semiconductor device 20) may include two FETs of the same conductive type and sharing a common source/drain node. The FETs include two of the gate structures 102 each described with reference to FIG. 1. The gate structures 102 are embedded in the stack of dielectric layers (e.g., including the dielectric layer 114 and the dielectric layer 116), and separately stand on the active area AA. The active area AA in the semiconductor substrate 100 may be defined by an isolation structure 202. In some embodiments, the isolation structure 202 is a trench isolation structure extending into the semiconductor substrate 100 from its top surface, and laterally surrounding the active area AA. The isolation structure 202 is formed of an insulating material, such as silicon oxide, silicon nitride, silicon oxynitride, the like or combinations thereof.

Three of the source/drain structures 112 may be disposed in the active area AA. The gate structures 102 are respectively located between adjacent ones of the three source/drain structures 112. One of the source/drain structures 112 is located between the gate structures 102, and functioned as the common source/drain node of the FETs. In some embodiments, the source/drain structure 112 as the common source/drain node of the FETs may be coupled to a bit line, as will be further described. On the other hand, the other two of the source/drain structures 112 are located at opposite sides of the gate structures 102, and may be coupled to a storage capacitor, as will be further described as well.

The semiconductor device 20 may further include contact plugs 204. The contact plugs 204 respectively extend through the dielectric layers 114, 116, to one of the source/drain structures 112, so as to establish electrical contact with the source/drain structure 112. The contact plug 204 standing on the source/drain structure 112 between the gate structures 102 may be configured to connect this source/drain structure 112 to a bit line (as will be further described), and may be referred as a bit line contact. This contact plug 204 (i.e., the bit line contact) is laterally spaced apart from the gate electrodes 104 of the gate structures 102 by the sidewall spacers 110 of the gate structures 102. As a result of having the air gaps AG with ultra-low dielectric constant sealed between adjacent ones of the sidewall spacers 110, a parasitic capacitance between the gate electrodes 104 and the contact plug 204 can be lowered. Therefore, a RC delay on signal transmission through the gate electrodes 104 and this contact plug 204 (i.e., the bit line contact) can be effectively minimized. On the other hand, other two of the source/drain structures 112 at opposite sides of the gate structures 102 may be respectively connected to a storage capacitor (not shown) through the contact plugs 204 standing on these source/drain structures 112, and these contact plugs 204 may be referred as capacitor contacts. As similar to the bit line contact, the capacitor contacts are each laterally spaced apart from the gate electrode 104 of one of the gate structures 102 by the sidewall spacers 110 of the gate structure 102, and RC delay on signal transmission through the gate electrode 104 and these contact plugs 204 (i.e., the capacitor contacts) can be effectively minimized as a result of the air gap AG sealed between adjacent ones of the sidewall spacers 110. The contact plugs 204 are formed of a conductive material. For instance, the conductive material may include tungsten, titanium, titanium nitride, the like or combinations thereof.

Conductive patterns 206 may respectively lie on one of the contact plugs 204. Each conductive pattern 206 is electrically connected to the underlying source/drain structure 112 through the contact plug 204 in between. In some embodiments, the conductive pattern 206 lying on and electrically connected to the source/drain structure 112 between the gate structures 102 may be a bit line. Although not shown, such conductive pattern 206 may be formed in a line shape. On the other hand, other two of the conductive patterns 206 lying above and electrically connected to the source/drain structures 112 at opposite sides of the gate structures 102 may be landing pads on which storage capacitors (not shown) are disposed. Each of these conductive patterns 206 (i.e., the landing pads) may have a footprint area greater than a footprint area of the underlying contact plug 204, thus overlay issue of the storage capacitors can be effectively minimized. The conductive patterns 206 are formed of a conductive material. For instance, the conductive material may include copper, titanium, titanium nitride, the like or combinations thereof. In some embodiments, the conductive patterns 206 are formed in an additional dielectric layer 208. In these embodiments, the conductive patterns 206 may be each laterally surrounded by the additional dielectric layer 208. The additional dielectric layer 208 may be formed of the dielectric material for forming the dielectric layers 114, 116. However, the dielectric material for forming the additional dielectric layer 208 may be alternatively different from the dielectric material for forming the dielectric layers 114, 116. The dielectric material for forming the additional dielectric layer 208 may include, for example, silicon oxide, silicon nitride, silicon carbonitride, silicon boron nitride (SiBN), silicon oxycarbonitride (SiOCN), silicon oxynitride, silicon oxycarbide, silicon carbide, the like or combinations thereof.

Figure 3:
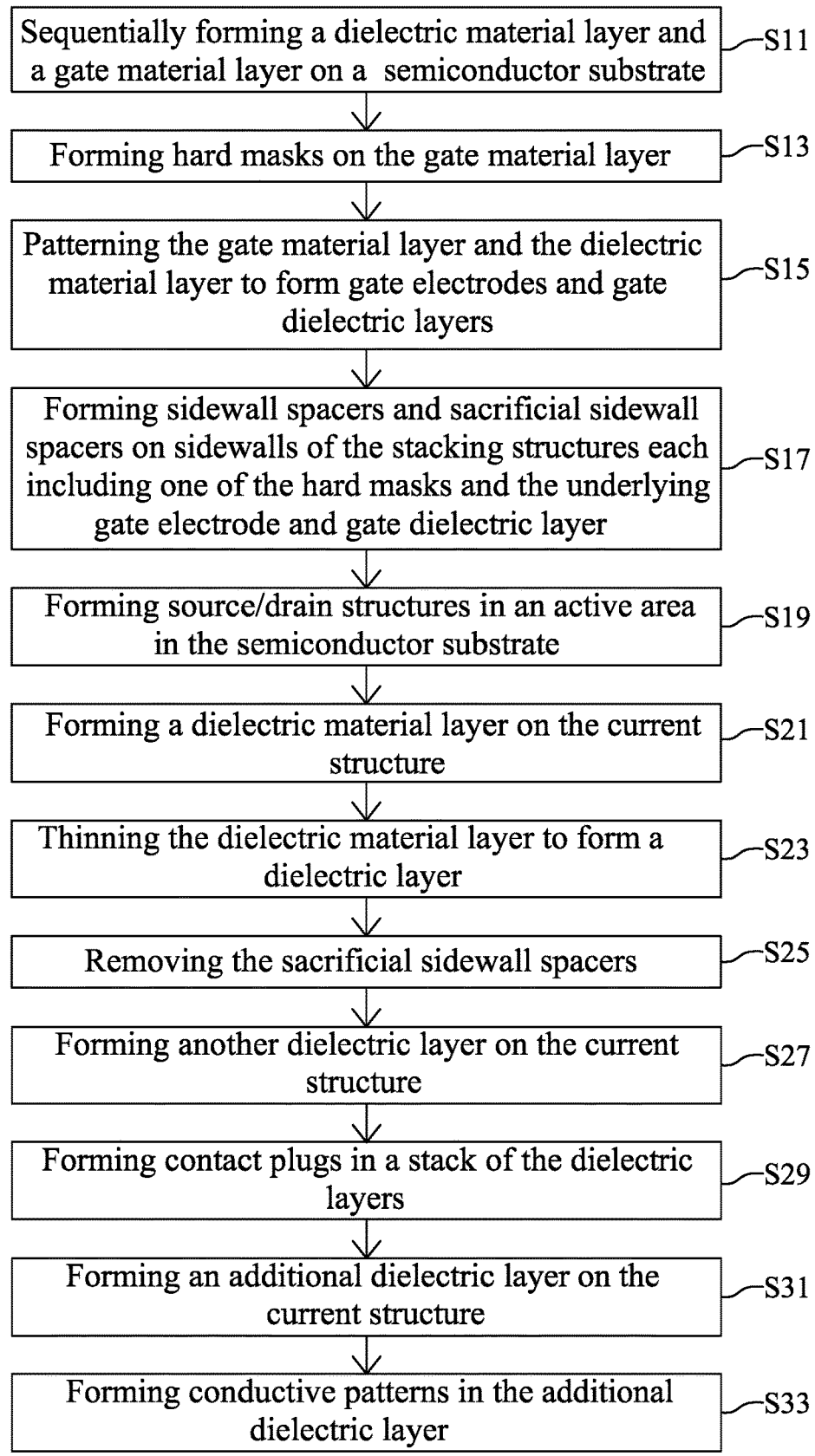
FIG. 3 is a flow diagram illustrating a method for manufacturing the semiconductor device as shown in FIG. 2, according to some embodiments of the present disclosure.

FIG. 3 is a flow diagram illustrating a method for manufacturing the semiconductor device 20 as shown in FIG. 2, according to some embodiments of the present disclosure. FIG. 4A through FIG. 4K are schematic cross-sectional view illustrating intermediate structures at various stages during the manufacturing process for forming the semiconductor device 20 as shown in FIG. 3.

Figure 4A:
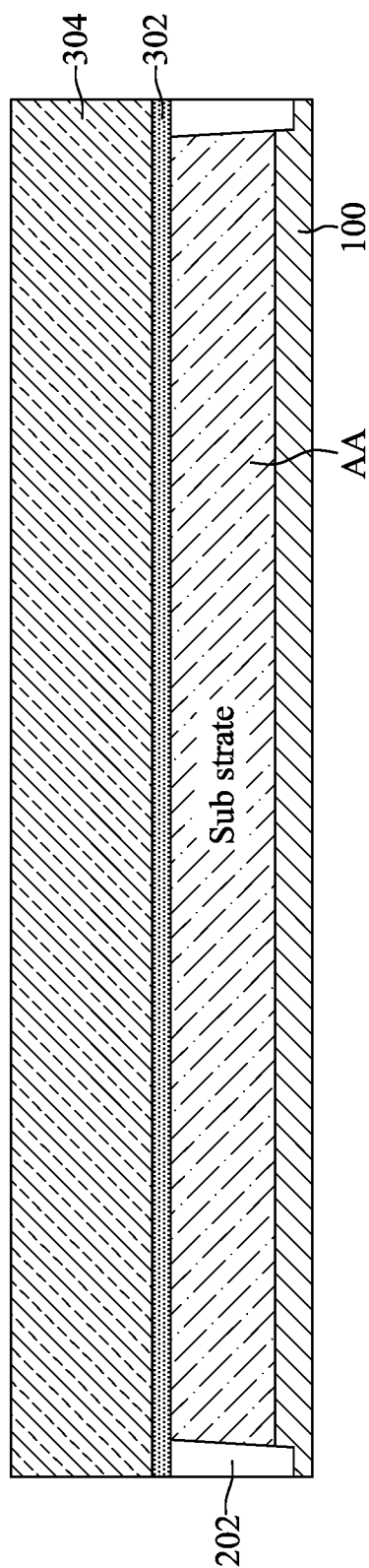
FIG. 4A through FIG. 4K are schematic cross-sectional view illustrating intermediate structures at various stages during the manufacturing process for forming the semiconductor device as shown in FIG. 3.

Referring to FIG. 3 and FIG. 4A, step S11 is performed, and a dielectric material layer 302 and a gate material layer 304 are sequentially formed on the semiconductor substrate 100. The semiconductor substrate 100 is formed with the active area AA and the isolation structure 202 laterally surrounding the active area AA. The dielectric material layer 302 and the gate material layer 304 may globally cover the semiconductor substrate 100. The dielectric material layer 302 will be patterned to form the gate dielectric layers 106 as described with reference to FIG. 1 and FIG. 2, and the gate material layer 304 will be patterned to form the gate electrodes 104 as described with reference to FIG. 1 and FIG. 2. In some embodiments, a method for forming the dielectric material layer 302 includes an oxidation process or a deposition process (e.g., a chemical vapor deposition (CVD) process). In addition, in some embodiments, a method for forming the gate material layer 304 includes a deposition process (e.g., a CVD process).

Figure 4B:
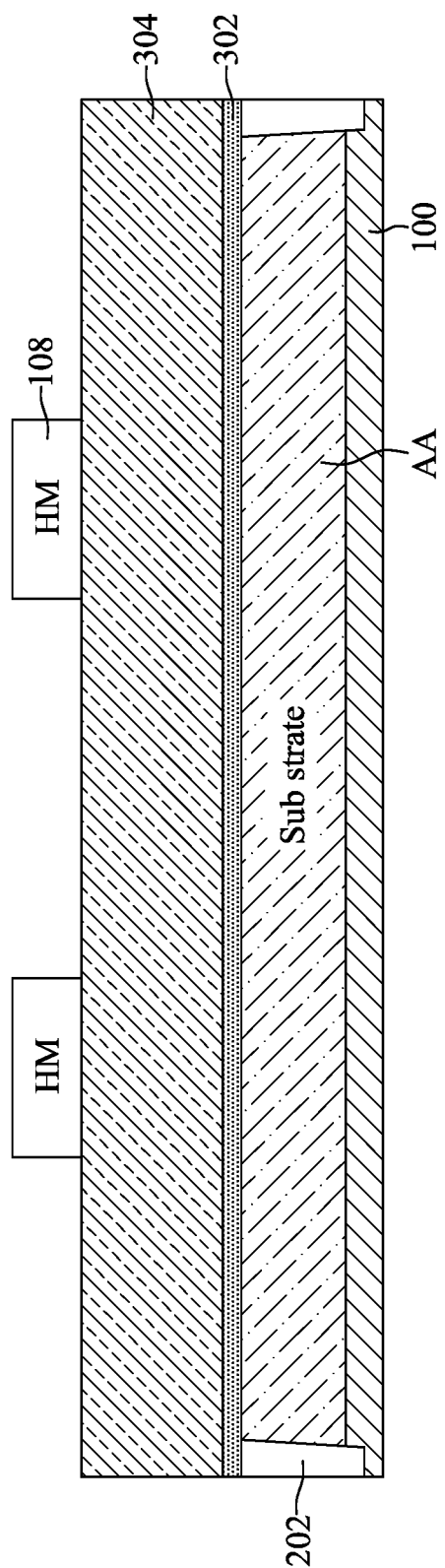

Referring to FIG. 3 and FIG. 4B, step S13 is performed, and the hard masks 108 are formed on the gate material layer 304. The hard masks 108 are laterally spaced apart from each other, and will be functioned as shadow masks for patterning the gate material layer 304 and the dielectric material layer 302 in the following step. In some embodiments, a method for forming the hard masks 108 includes using a deposition process (e.g., a CVD process) for forming a material layer globally covering the gate material layer 304, and performing a lithography process and an etching process (e.g., an anisotropic etching process) for patterning the material layer to form the hard masks 108.

Figure 4C:
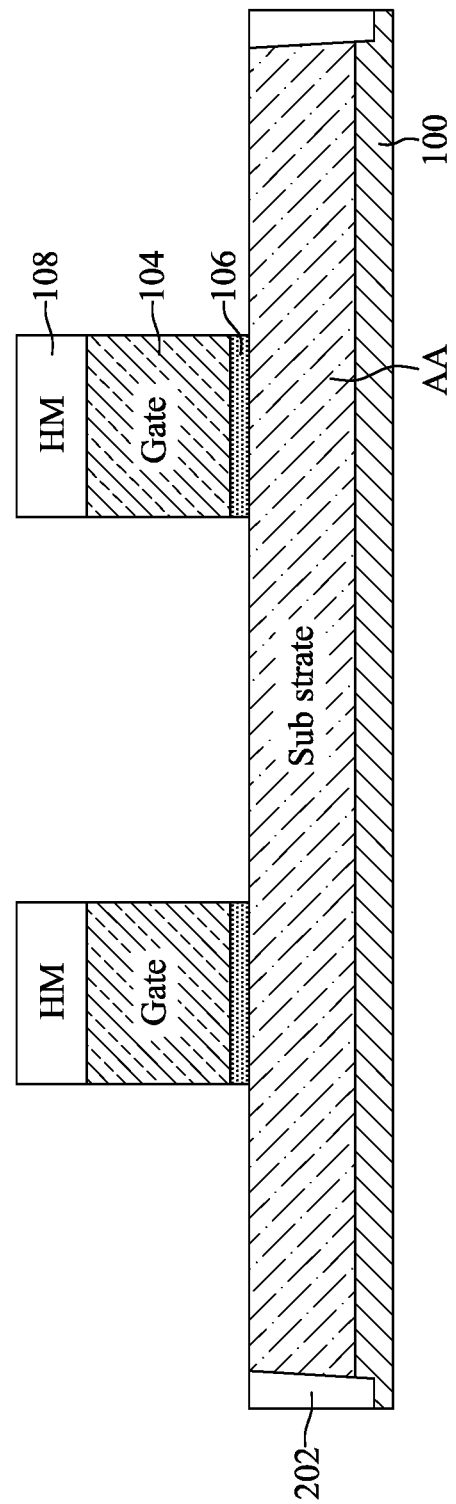

Referring to FIG. 3 and FIG. 4C, step S15 is performed, and the gate material layer 304 and the dielectric material layer 302 are patterned. The gate material layer 304 is patterned to form the gate electrodes 104, while the dielectric material layer 302 is patterned to form the gate dielectric layers 106. In some embodiments, a method for patterning the gate material layer 304 and the dielectric material layer 302 includes an etching process, such as an anisotropic etching process. During the etching process, the hard masks 108 may be functioned as shadow masks, and the patterning may be considered as a self-aligned process.

Figure 4D:
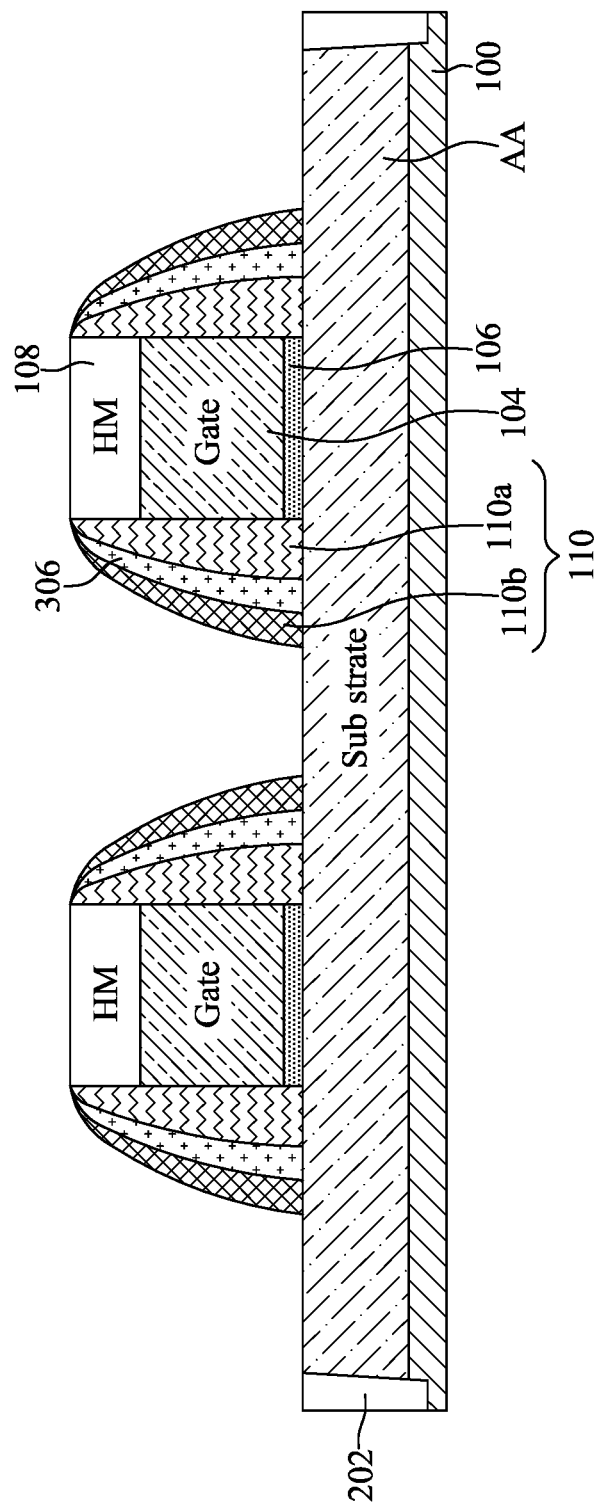

Referring to FIG. 3 and FIG. 4D, step S17 is performed, and the sidewall spacers 110a, 110b as well as sacrificial sidewall spacers 306 are formed on sidewalls of the stacking structure each including one of the hard masks 108 and the underlying gate electrode 104 and gate dielectric layer 106. Each sacrificial sidewall spacer 306 lies between a sidewall spacer 110a and a sidewall spacer 110b, and is similar to the sidewall spacers 110a, 110b in terms of shape. The sacrificial sidewall spacers 306 will be removed, and space occupied by the sacrificial sidewall spacers 306 will become the air gaps AG as described with reference to FIG. 1 and FIG. 2. In order to remove the sacrificial sidewall spacers 306 without damaging the sidewall spacers 110a, 110b, the sacrificial sidewall spacers 306 must have sufficient etching selectivity with respect to the sidewall spacers 110a, 110b. In some embodiments, the sacrificial sidewall spacers 306 are formed of doped silicon oxide, whereas the sidewall spacers 110a, 110b are respectively formed of a carbon-containing material. In addition, the carbon-containing material may include high density carbon (HDC), silicon carbide (SiC) or silicon carbonitride (SiCN). For instance, the sidewall spacers 110a may be formed of HDC, whereas the inner sidewalls 110b may be formed of HDC, SiC or SiCN. As compared to using silicon oxide for forming the sacrificial sidewall spacers 306 and silicon nitride for forming the sidewall spacers 110a, 110b, forming the sacrificial sidewall spacers 306 and the sidewall spacers 110a, 110b by the combination of the doped silicon oxide and the carbon-containing materials may result in better etching selectivity of the sacrificial sidewall spacers 306 with respect to the sidewall spacers 110a, 110b. Therefore, the sidewall spacers 110a, 110b may remain substantially intact even after removal of the sacrificial sidewall spacers 306, and undesired electrical paths laterally extending to the gate electrodes 104 from aside the gate electrodes 104 can be effectively avoided.

In some embodiments, a method for forming the sidewall spacers 110a includes forming a material layer globally and conformally covering the semiconductor substrate 100 and the stacking structures each including one of the hard masks 108 and the underlying gate electrode 104 and gate dielectric layer 106, and performing an anisotropic etching process on this material layer. During the anisotropic etching process, portions of the material layer covering top surfaces of the hard masks 108 as well as portions of the material layer extending along the top surface of the semiconductor substrate 100 are removed, and portions of the material layer covering sidewalls of the stacking structures are shaped to form the sidewall spacers 110a. Subsequently, the sacrificial sidewall spacers 306 and the sidewall spacers 110b are respectively formed by a similar method.

Figure 4E:
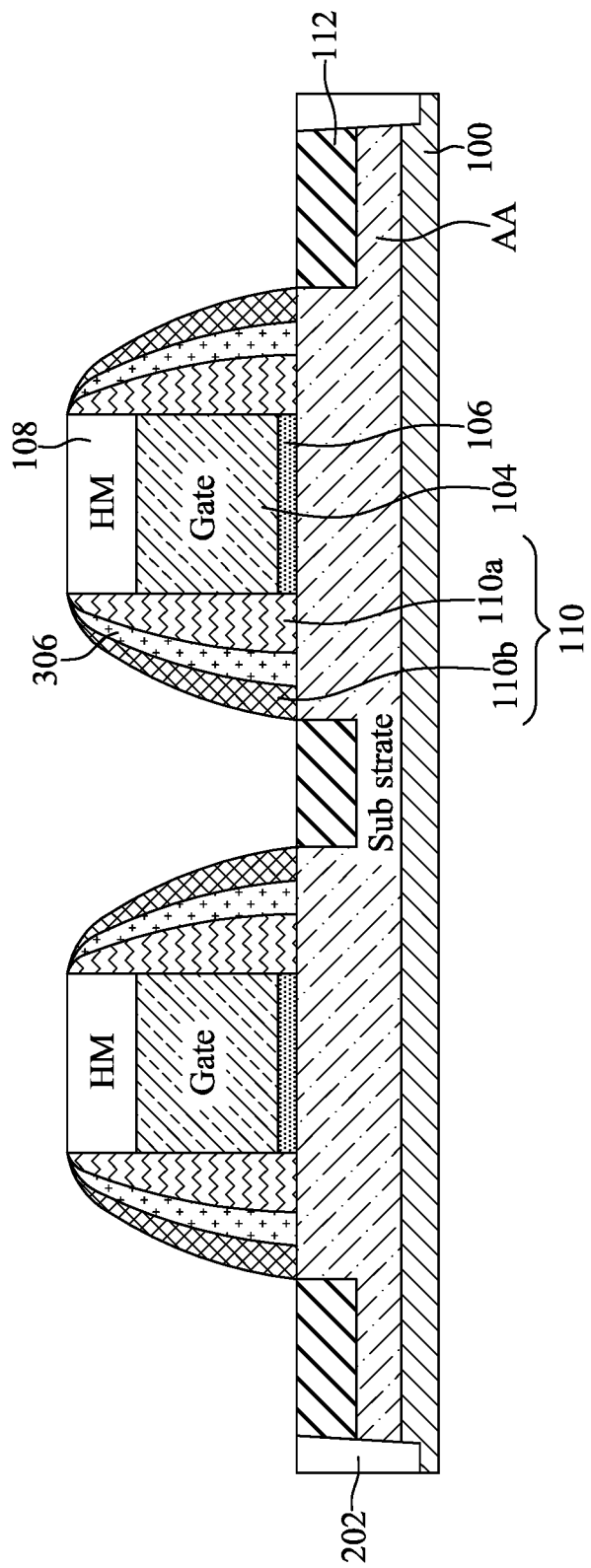

Referring to FIG. 3 and FIG. 4E, step S19 is performed, and the source/drain structures 112 are formed in the active area AA. In those embodiments where the source/drain structures 112 are doped regions in the active area AA, a method for forming the source/drain structures 112 may include performing an ion implantation process. Exposed portions of the active area AA are subjected to the ion implantation, and the source/drain structures 112 are formed in these exposed regions of the active area AA. On the other hand, in those embodiments where the source/drain structures 112 are epitaxial structures in recesses at the top surface of the active area AA, a method for forming the source/drain structures 112 may include forming the recesses by performing an etching process (e.g., an anisotropic etching process). The exposed portions of the active area AA are subjected to etchants, and the recesses are formed in the exposed regions of the active area AA. Subsequently, the source/drain structures 112 may be formed in these recesses by an epitaxial process.

Figure 4F:
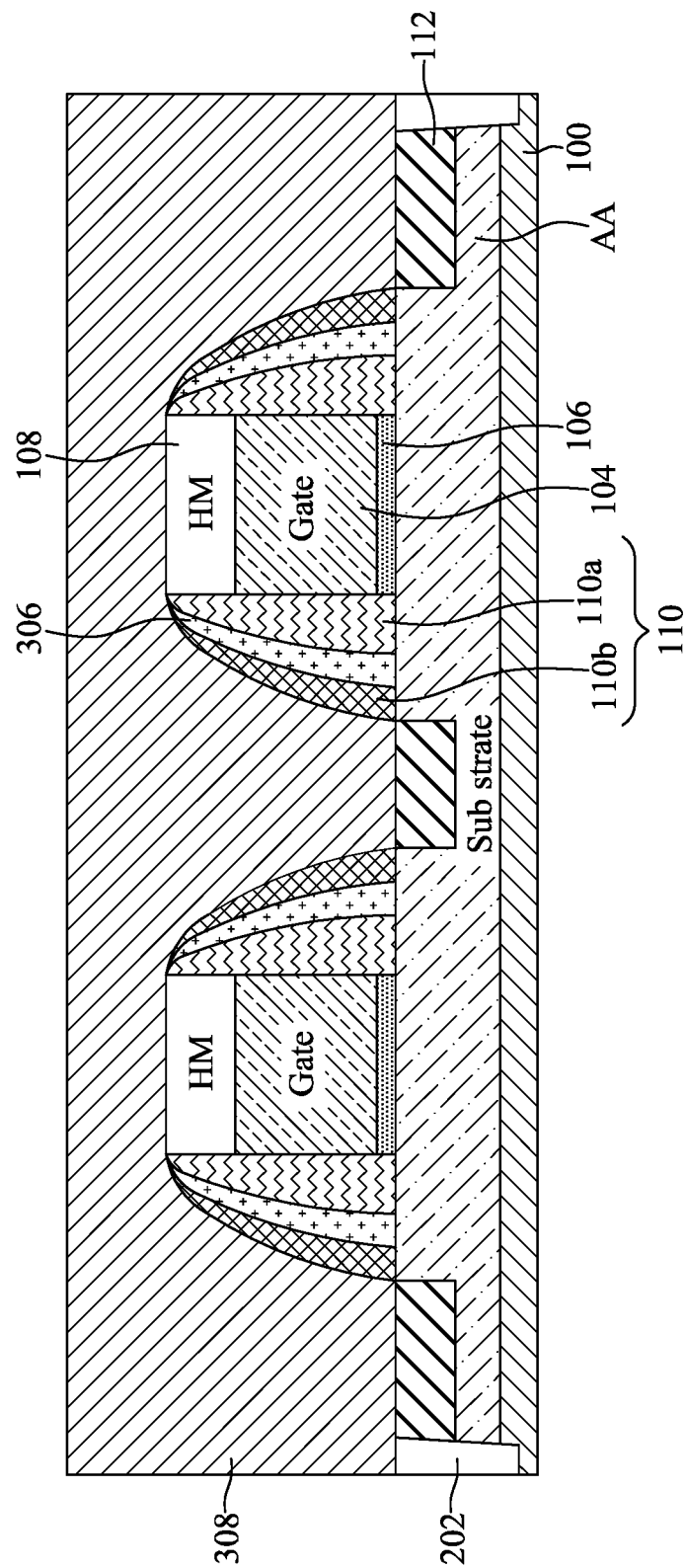

Referring to FIG. 3 and FIG. 4F, step S21 is performed, and a dielectric material layer 308 is formed on the current structure. The dielectric material layer 308 will be thinned to form the dielectric layer 114 as described with reference to FIG. 1 and FIG. 2. Currently, the semiconductor substrate 100, the sidewall spacers 110a, 110b, the sacrificial sidewall spacers 306 and the stacking structures each including one of the hard masks 108 and the underlying gate electrode 104 and gate dielectric layer 106 are covered by the dielectric material layer 308. In some embodiments, a method for forming the dielectric material layer 308 includes a deposition process, such as a CVD process.

Figure 4G:
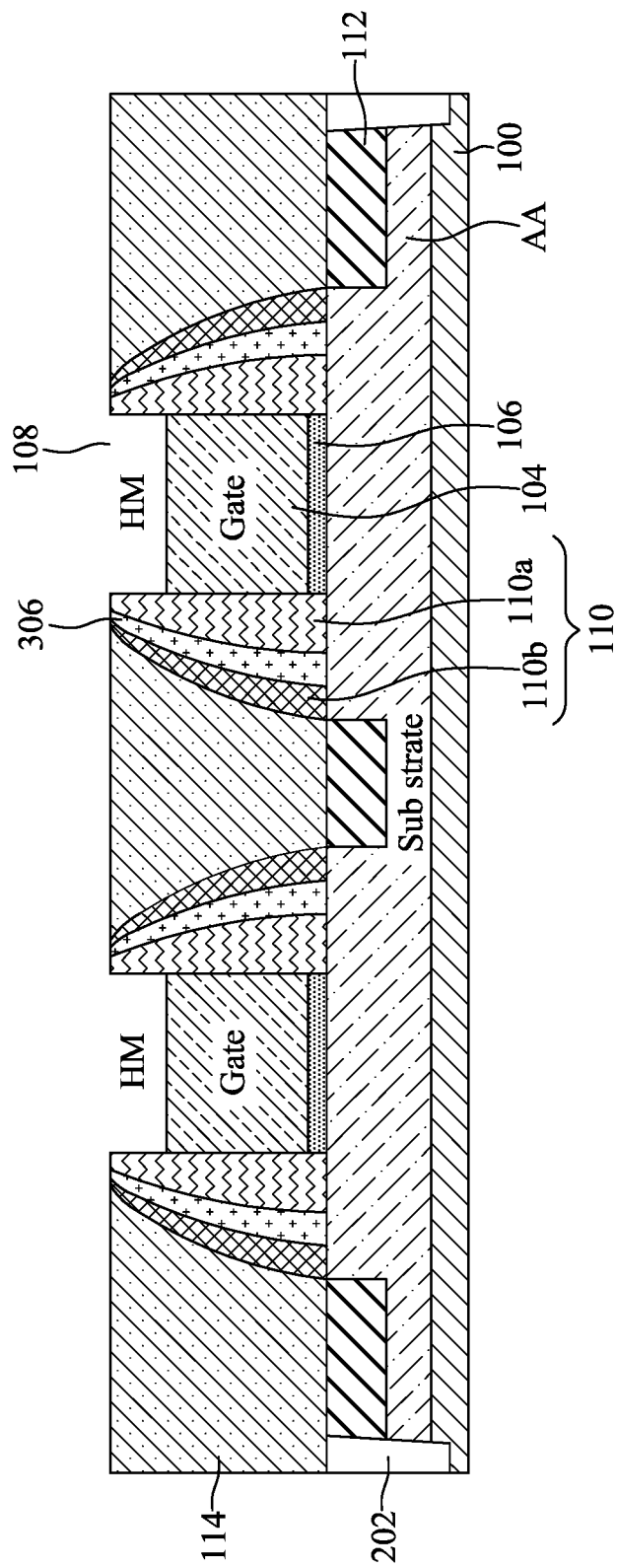

Referring to FIG. 3 and FIG. 4G, step S23 is performed, and a top portion of the dielectric material layer 308 is removed. Consequently, the dielectric material layer 308 is thinned to form the dielectric layer 114, and the top surfaces of the hard masks 108 as well as the top ends of the sidewall spacers 110a, 110b and the sacrificial sidewall spacers 306 are exposed. In some embodiments, a method for removing the top portion of the dielectric material layer 308 includes a planarization process. For instance, the planarization process may include a polishing process, an etching process or a combination thereof.

Figure 4H:
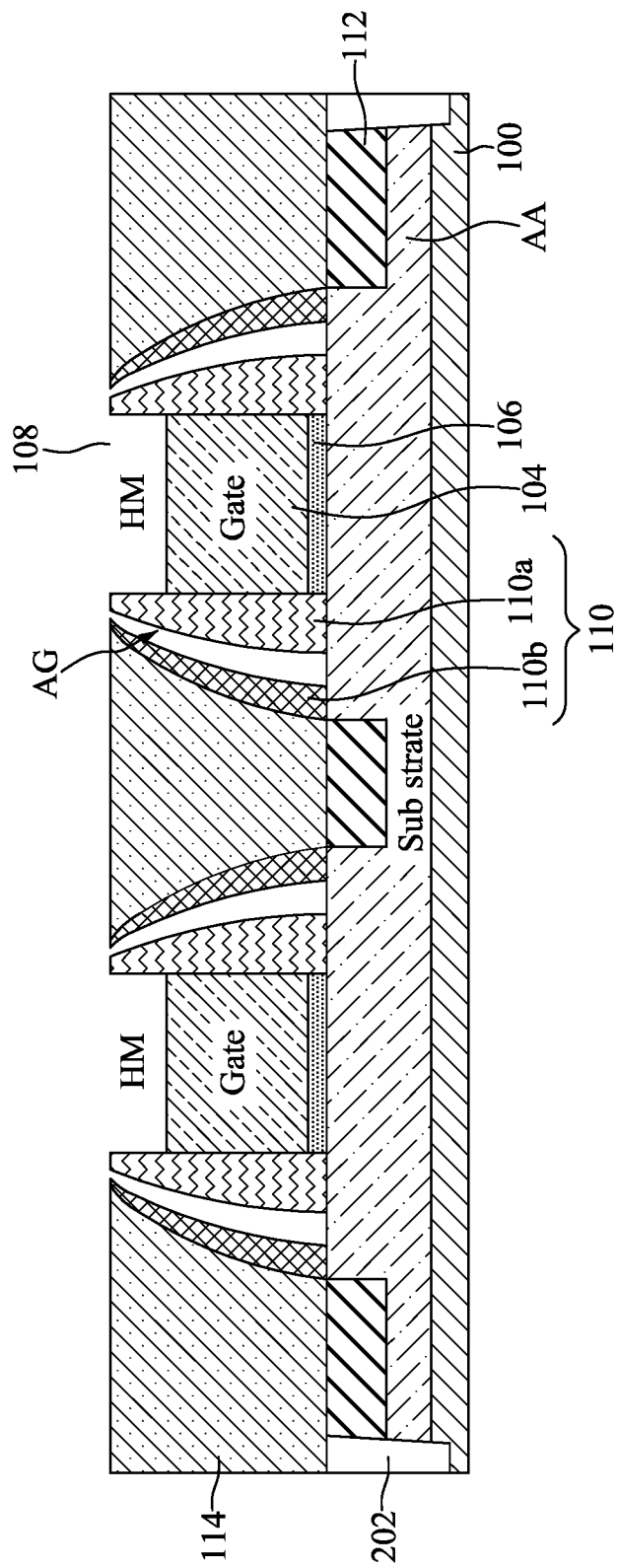

Referring to FIG. 3 and FIG. 4H, step S25 is performed, and the sacrificial sidewall spacers 306 are removed. Accordingly, the space previously occupied by the sacrificial sidewall spacers 306 become the air gaps AG. It should be noted that, currently, the air gaps AG have not been sealed, and top ends of the air gaps AG may be communicated to outside. In some embodiments, a method for removing the sacrificial sidewall spacers 306 includes an etching process, such as an isotropic etching process. In those embodiments where the sacrificial sidewall spacers 306 are formed of the doped silicon oxide and the sidewall spacers 110a, 110b are each formed of the carbon-containing material, the etchant used for the etching process may include vapor hydrofluoric acid (VHF). The etchant used for the etching process may react with the sacrificial sidewall spacers 306 from the top ends of the sacrificial sidewall spacers 306. Since the sacrificial sidewall spacers 306 have sufficient etching selectivity with respect to the sidewall spacers 110a, 110b, the sidewall spacers 110a, 110b may remain substantially intact during the removal of the sacrificial sidewall spacers 306.

Figure 4I:
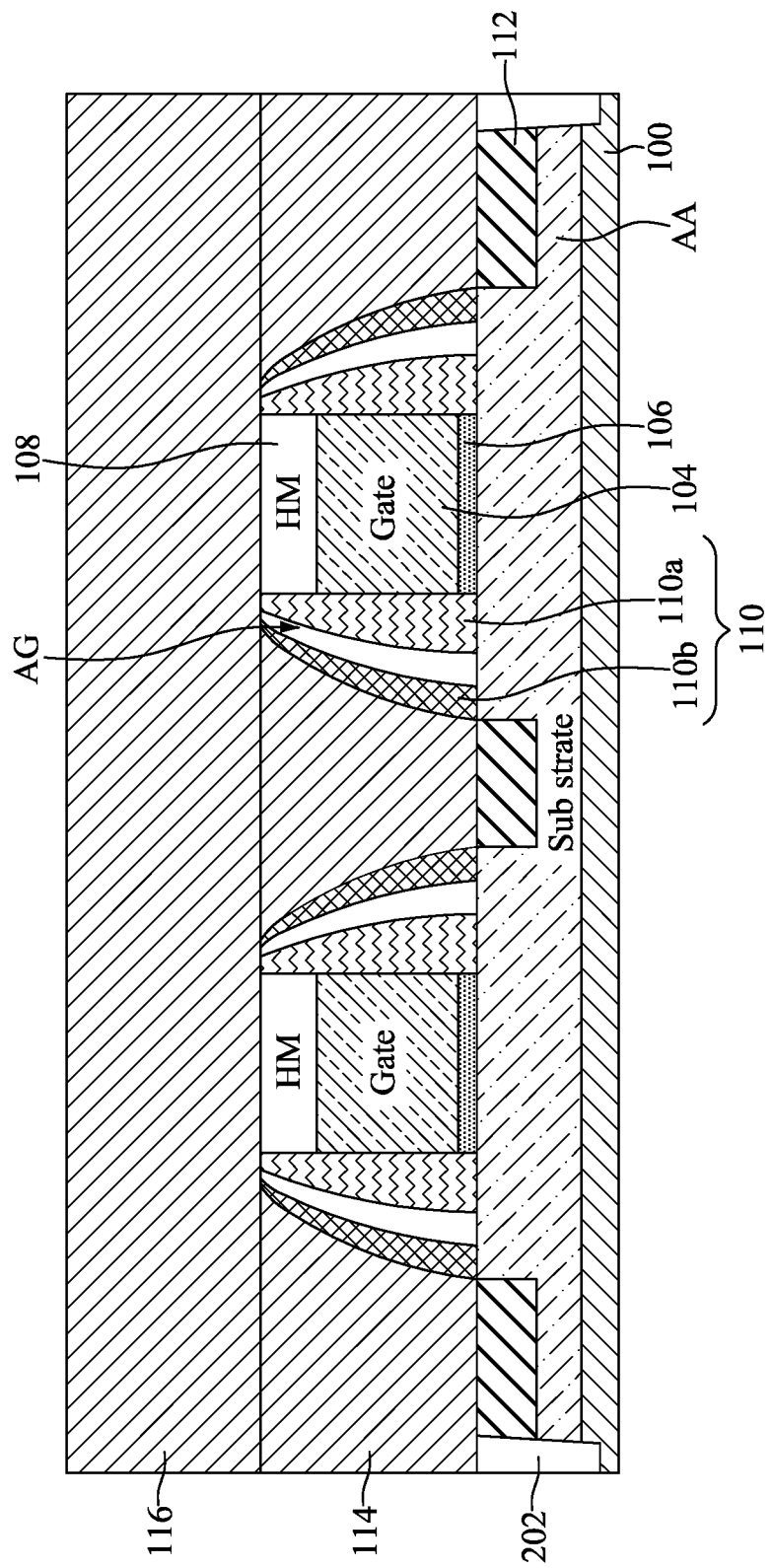

Referring to FIG. 3 and FIG. 4I, step S27 is performed, and the dielectric layer 116 is formed on the dielectric layer 114. The dielectric layer 116 may globally cover the dielectric layer 114, and the sidewall spacers 110a, 110b as well as the hard masks 108 are covered by the dielectric layer 116. The air gaps AG are respectively identical to a removed sacrificial sidewall spacer 306 in terms of shape, and each has a tapered top portion. As a result, the top ends of the air gaps AG are rather narrow, and the dielectric layer 116 may barely fill into the air gaps AG through the narrow top ends of the air gaps AG. Therefore, the narrow top ends of the air gaps AG can be sealed by the dielectric layer 116. In some embodiments, a method for forming the dielectric layer 116 includes a deposition process (e.g., a CVD process).

Figure 4J:
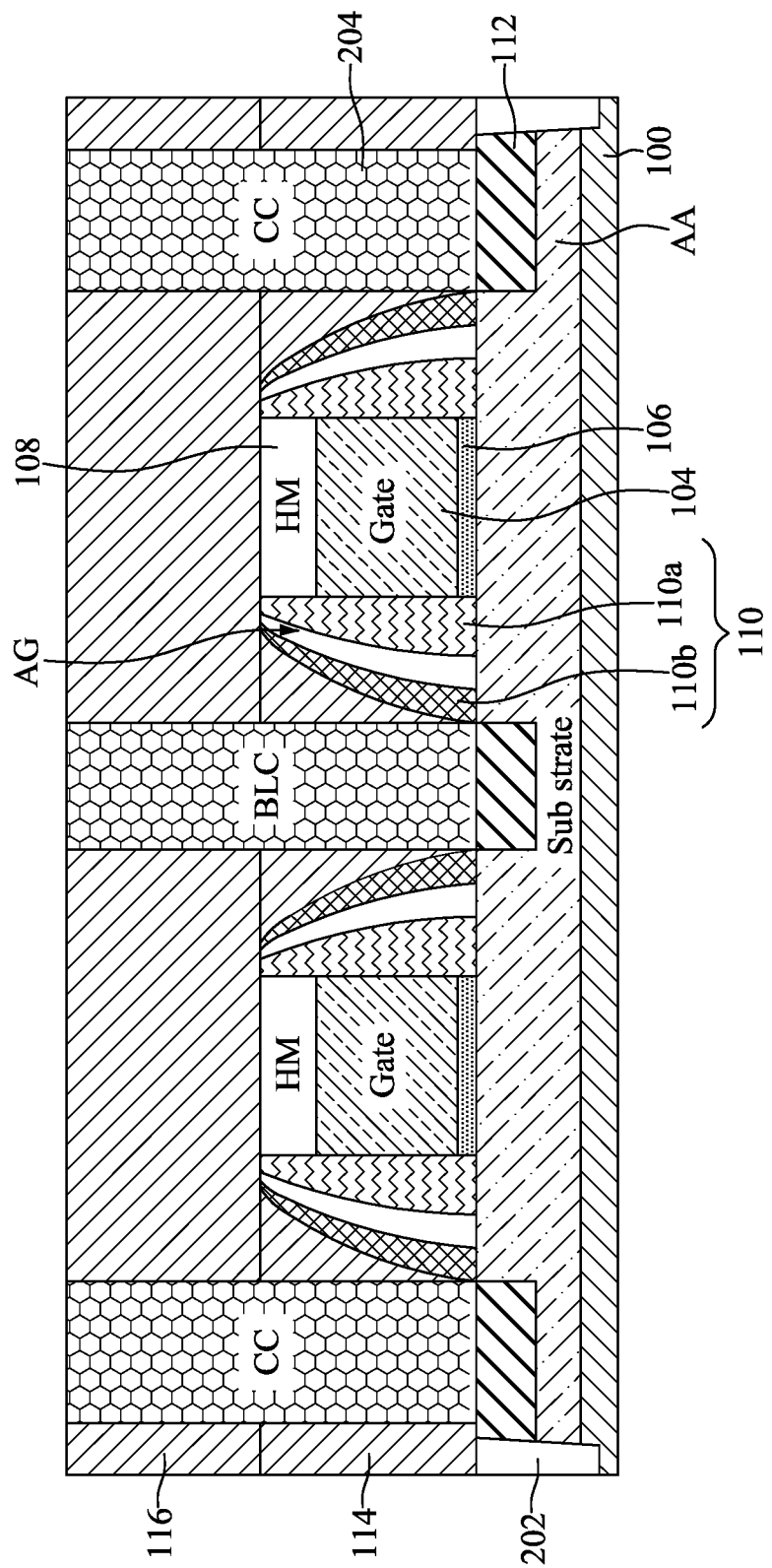

Referring to FIG. 3 and FIG. 4J, step S29 is performed, and the contact plugs 204 are formed in the dielectric layer 114, 116. The contact plugs 204 may extend through the dielectric layers 114, 116 to the source/drain structures 112, in order to establish electrical connection with the source/drain structures 112. In some embodiments, a method for forming the contact plugs 204 includes forming through holes in the dielectric layers 114, 116 by a lithography process and an etching process (e.g., an anisotropic etching process). During the etching process, the sidewall spacers 110b and the isolation structure 202 may be functioned as masks, and size of bottom portions of the through holes may be defined by spacing between adjacent sidewall spacers 110b and spacing between each sidewall spacer 110b and the isolation structure 202. In addition, the contact plugs 204 may or may not in lateral contact with the sidewall spacers 110b. After formation of the through holes, a conductive material may be filled into the through holes by a deposition process (e.g., a PVD process), a plating process or a combination thereof. The conductive material may extend onto a top surface of the dielectric layer 116, and a portion of the conductive material over the top surface of the dielectric layer 116 may be removed by a planarization process. For instance, the planarization process may include a polishing process, an etching process or a combination thereof.

Figure 4K:
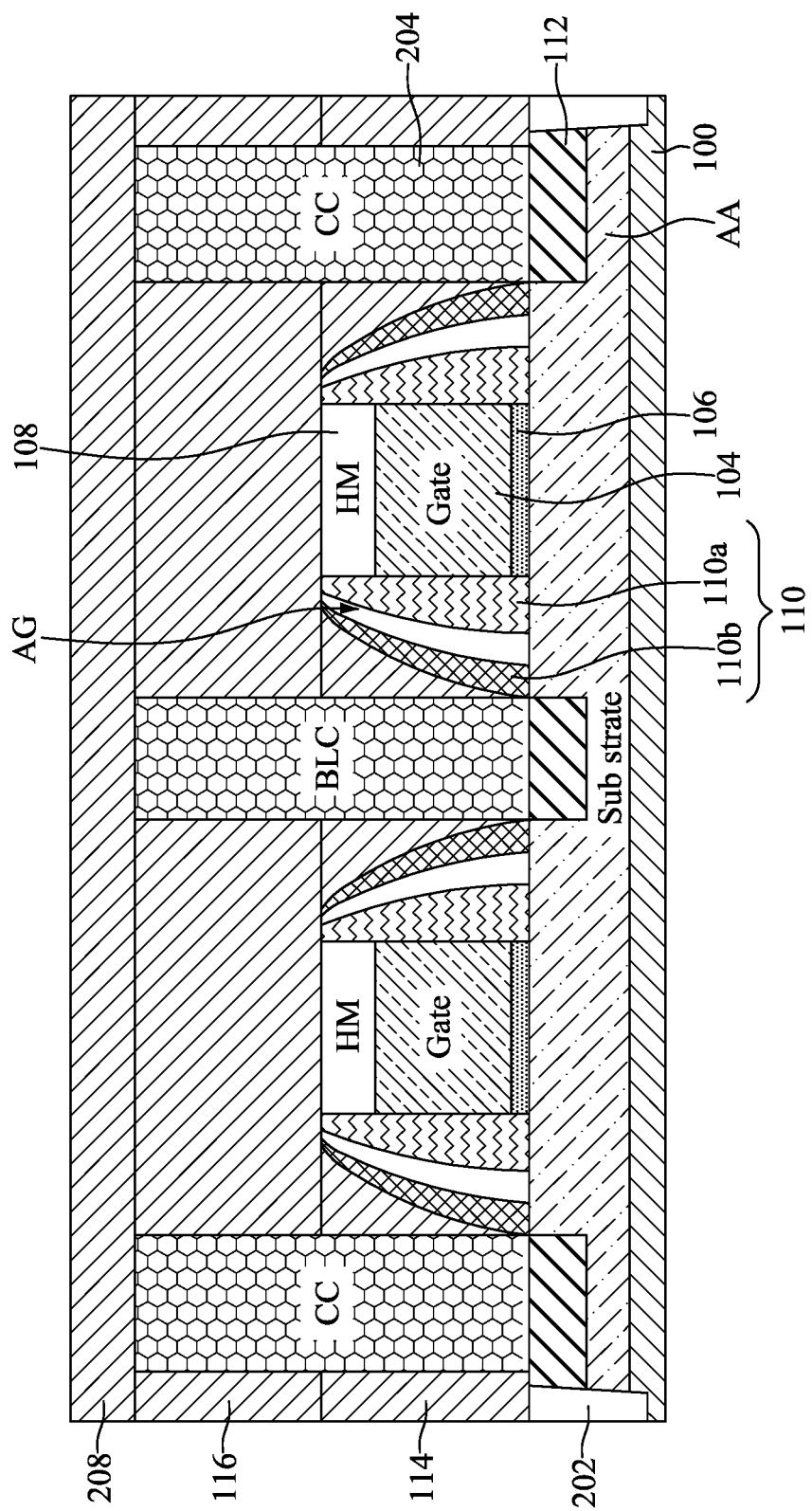

Referring to FIG. 3 and FIG. 4K, step S31 is performed, and the additional dielectric layer 208 is formed on the dielectric layer 116. The additional dielectric layer 208 may globally cover the dielectric layer 116. In some embodiments, a method for forming the additional dielectric layer 208 includes a deposition process (e.g., a CVD process).

Referring to FIG. 3 and FIG. 2, step S33 is performed, and the conductive patterns 206 are formed in the additional dielectric layer 208. In some embodiments, a method for forming the conductive patterns 206 includes forming openings in the additional dielectric layer 208 by a lithography process and an etching process, and filling a conductive material into these openings by a deposition process (e.g., a PVD process), a plating process or a combination thereof. The conductive material may fill up these openings, and may extend onto a top surface of the additional dielectric layer 208. Subsequently, portions of the conductive material above the additional dielectric layer 208 may be removed by a planarization process, and remained portions of the conductive material in these openings form the conductive patterns 206. For instance, the planarization process may include a polishing process, an etching process or a combination thereof.

Up to here, the semiconductor device 20 as shown in FIG. 2 has been formed. Although not shown, the semiconductor device 20 may be subjected to further processes at least to form storage capacitors on the additional dielectric layer 208. The storage capacitors may land on the conductive patterns 206 as the landing pads, and electrically connect to these conductive patterns 206. Moreover, additional backend-of-line (BEOL) process as well as a packaging process may be further performed to complete manufacturing of a semiconductor die.

Figure 5:
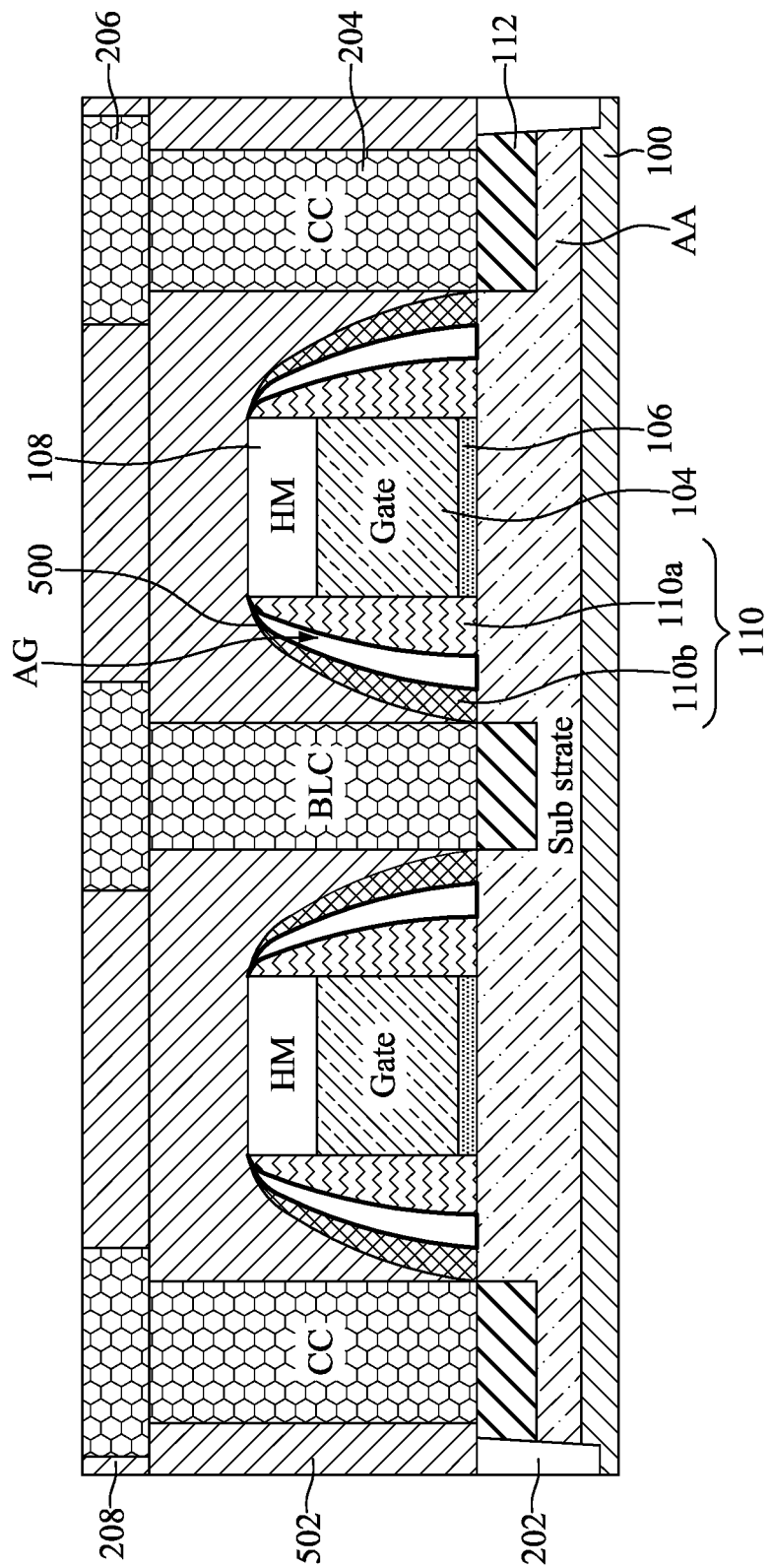
FIG. 5 is a schematic cross-sectional view illustrating a semiconductor device according to some embodiments of the present disclosure.

FIG. 5 is a schematic cross-sectional view illustrating a semiconductor device 50 according to some embodiments of the present disclosure. The semiconductor device 50 as shown in FIG. 5 is similar to the semiconductor device 20 as described with reference to FIG. 2. Only differences between the semiconductor devices 20, 50 will be described, and the same or the like parts of the semiconductor device 20, 50 may not be repeated again.

Referring to FIG. 5, according to some embodiments, the air gaps AG sealed in the gate structures 102 are enclosed by liner layers 500. The liner layers 500 define boundaries of the air gaps AG, such that outer sidewalls of the sidewall spacers 110a (i.e., sidewalls of the sidewall spacers 110a facing away from the gate electrodes 104), inner sidewalls of the sidewall spacers 110b (i.e., sidewalls of the sidewall spacers 110b facing toward the gate electrodes 104), and portions of the semiconductor substrate 100 between the sidewall spacers 110a, 110b are covered by the liner layers 500. In some embodiments, the liner layers 500 seal top ends of the air gaps AG. In addition, in those embodiments where each air gap AG has two portions at opposite sides of the corresponding gate electrode 104 in line shape, these portions of each air gap AG are respectively enclosed by one of the liner layers LN. The liner layers 500 may be a product of a decomposition reaction of an energy removable material (ERM). In some embodiments, the energy removable material may include a matrix material and a decomposable porogen material that is sacrificially removed upon being exposed to an energy source. In some embodiments, the energy source may include heat, light or a combination thereof. In some embodiments, the matrix material may include a methylsilsesquioxane (MSQ) based material, and the decomposable porogen material may include a porogen organic compound that provides porosity to the matrix material of the energy removable material. Upon exposing to light, heat or other energy source, the ERM may decompose to leave the air gaps AG in the space used to be occupied by the ERM, and to form the liner layers 500 as products of the decomposition reaction.

In some embodiments, the gate structures 102 may be laterally surrounded and covered by portions in the same dielectric layer 502. The dielectric layer 502 spans between the semiconductor substrate 100 and the dielectric layer 208, and may be as tall as the contact plugs 204 penetrating through the dielectric layer 502. To explain differently, the dielectric layers 114, 116 as described with reference to FIG. 2 may be considered as being replaced by the dielectric layer 502. In some embodiments, the portion of the dielectric layer 502 covering the gate structures 102 may be in contact with the air gaps AG through top ends of the liner layers 500, rather than in direct contact with the air gaps AG. A dielectric material for forming the dielectric layer 502 may be identical or different from the dielectric material for forming the dielectric layer 208. For instance, the dielectric layer for forming the dielectric layer 502 may include silicon oxide, silicon nitride, silicon carbonitride, silicon boron nitride (SiBN), silicon oxycarbonitride (SiOCN), silicon oxynitride, silicon oxycarbide, silicon carbide, the like or combinations thereof.

The semiconductor device 50 as described above may be formed by a method partially different from the method for forming the semiconductor device 20 as described with reference to FIG. 2, FIG. 3 and FIG. 4A through FIG. 4K.

Figure 6:
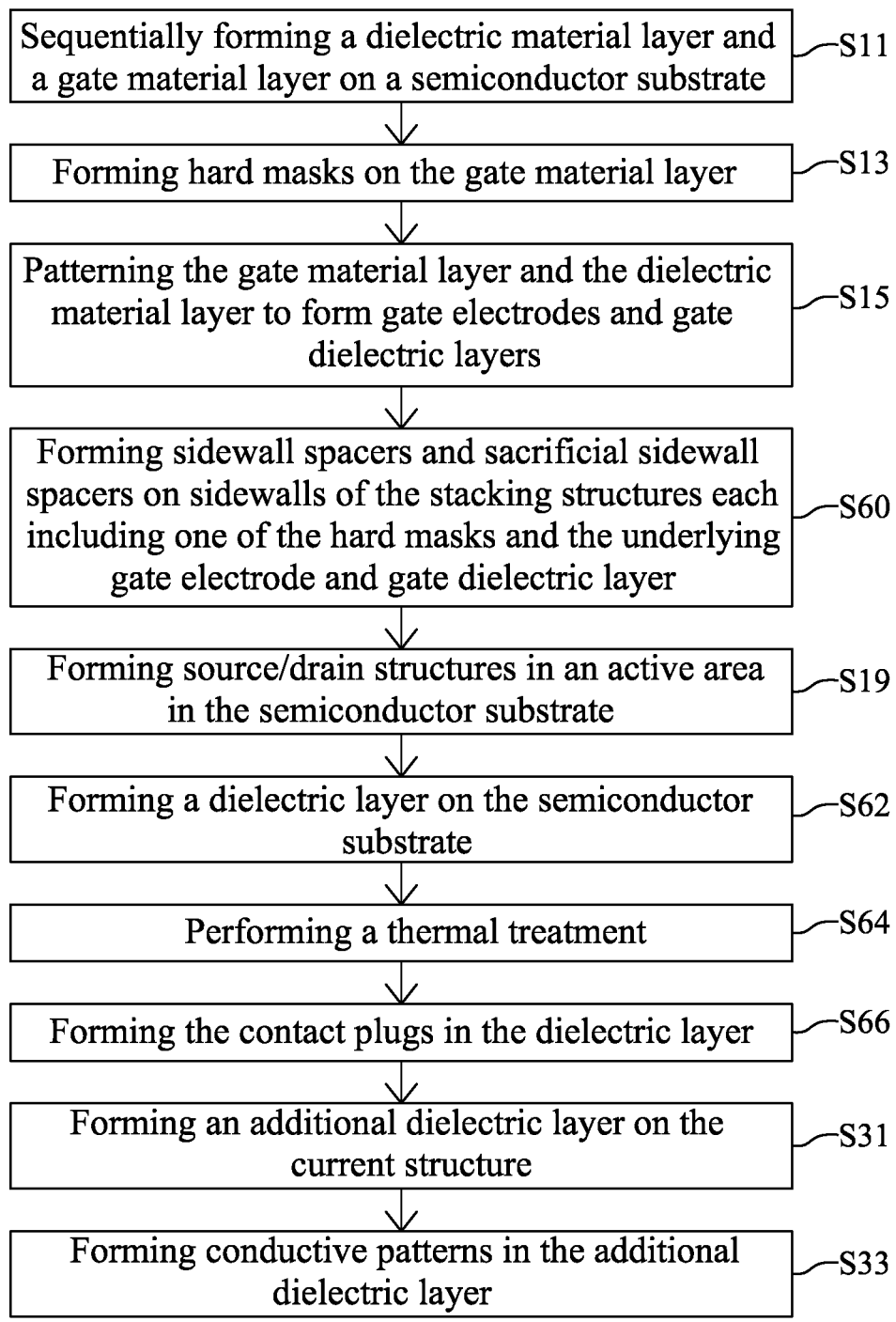
FIG. 6 is a flow diagram illustrating a method for manufacturing the semiconductor device as shown in FIG. 5, according to some embodiments of the present disclosure.

FIG. 6 is a flow diagram illustrating a method for manufacturing the semiconductor device 50 as shown in FIG. 5, according to some embodiments of the present disclosure. FIG. 7A through FIG. 7E are schematic cross-sectional view illustrating intermediate structures at various stages during the manufacturing process for forming the semiconductor device 50 as shown in FIG. 6.

Referring to FIG. 6, the method for manufacturing the semiconductor device 50 as shown in FIG. 5 may begin with performing the steps S11, S13, S15 as described with reference to FIG. 3 and FIG. 4A through FIG. 4C.

Figure 7A:
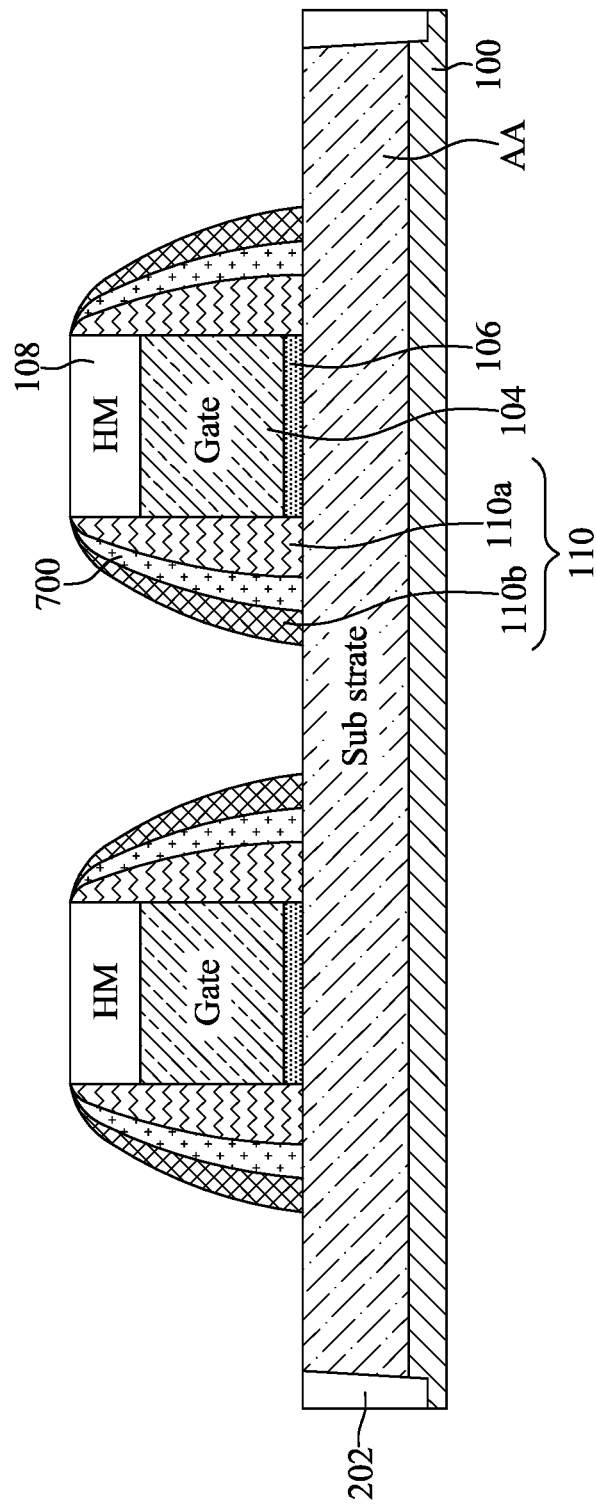
FIG. 7A through FIG. 7E are schematic cross-sectional view illustrating intermediate structures at various stages during the manufacturing process for forming the semiconductor device as shown in FIG. 6.

Subsequently, as shown in FIG. 6 and FIG. 7A, step S60 is performed, and the sidewall spacers 110a, 110b as well as sacrificial sidewall spacers 700 are formed on sidewalls of the stacking structures each including one of the hard masks 108 and the underlying gate electrode 104 and gate dielectric layer 106. Each sacrificial sidewall spacer 700 lies between a sidewall spacer 110a and a sidewall spacer 110b, and is similar to the sidewall spacers 110a, 110b in terms of shape. The sacrificial sidewall spacers 700 may be formed of the ERM as described with reference to FIG. 5. After performing a thermal treatment in a following step, the sacrificial sidewall spacers 700 may decompose to form the air gaps AG and the liner layers 500 as described with reference to FIG. 5. A method for forming each of the sidewall spacers 110a, 110b and the sacrificial sidewall spacers 700 may be identical with the method for forming each of the sidewall spacers 110a, 110b and the sacrificial sidewall spacers 110a, 110b and the sacrificial sidewall spacers 306 as described with reference to FIG. 3 and FIG. 4D, and would not be described again.

Figure 7B:
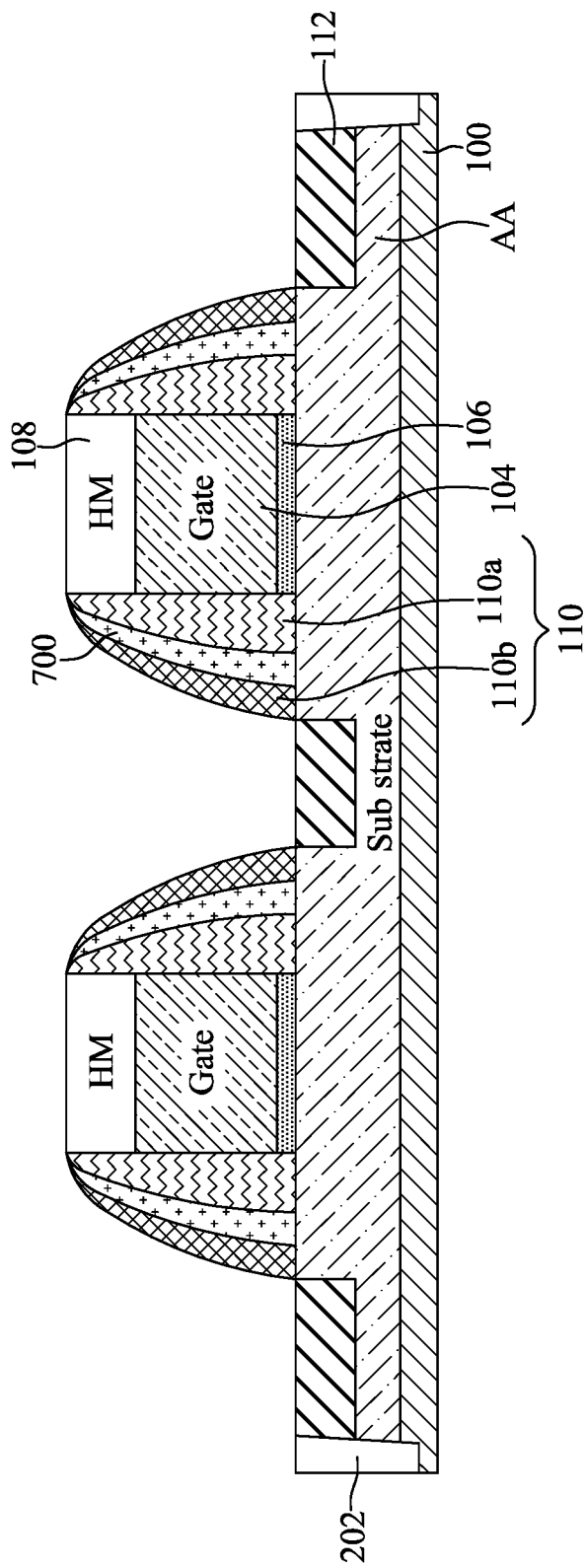

Referring to FIG. 6 and FIG. 7B, step S19 is performed, and the source/drain structures 112 are formed in the active area AA. The step S19 has been described with reference to FIG. 3 and FIG. 4E, and would not be described herein.

Figure 7C:
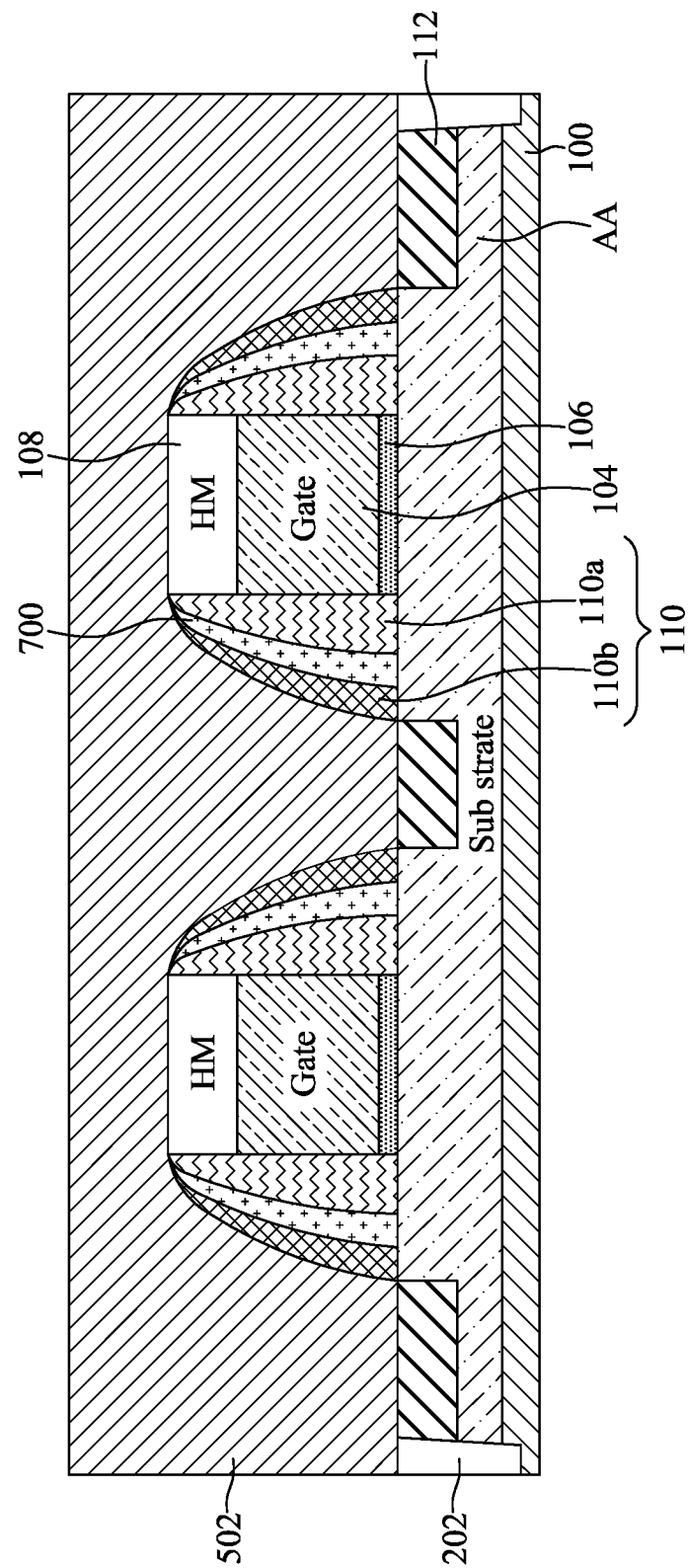

Referring to FIG. 6 and FIG. 7C, step S62 is performed, and the dielectric layer 502 is formed on the semiconductor substrate 100. The dielectric layer 502 may globally cover the structure as shown in FIG. 7B, and the semiconductor substrate 100, the sidewall spacers 110a, 110b, the sacrificial sidewall spacers 700 and the stacking structures each including one of the hard masks 108 and the underlying gate electrode 104 and gate dielectric layer 106 are covered by the dielectric material layer 502. Accordingly, a thickness of the dielectric layer 502 may be greater than a total height of the gate structures 102. In some embodiments, a method for forming the dielectric layer 502 includes a deposition process, such as a CVD process.

Figure 7D:
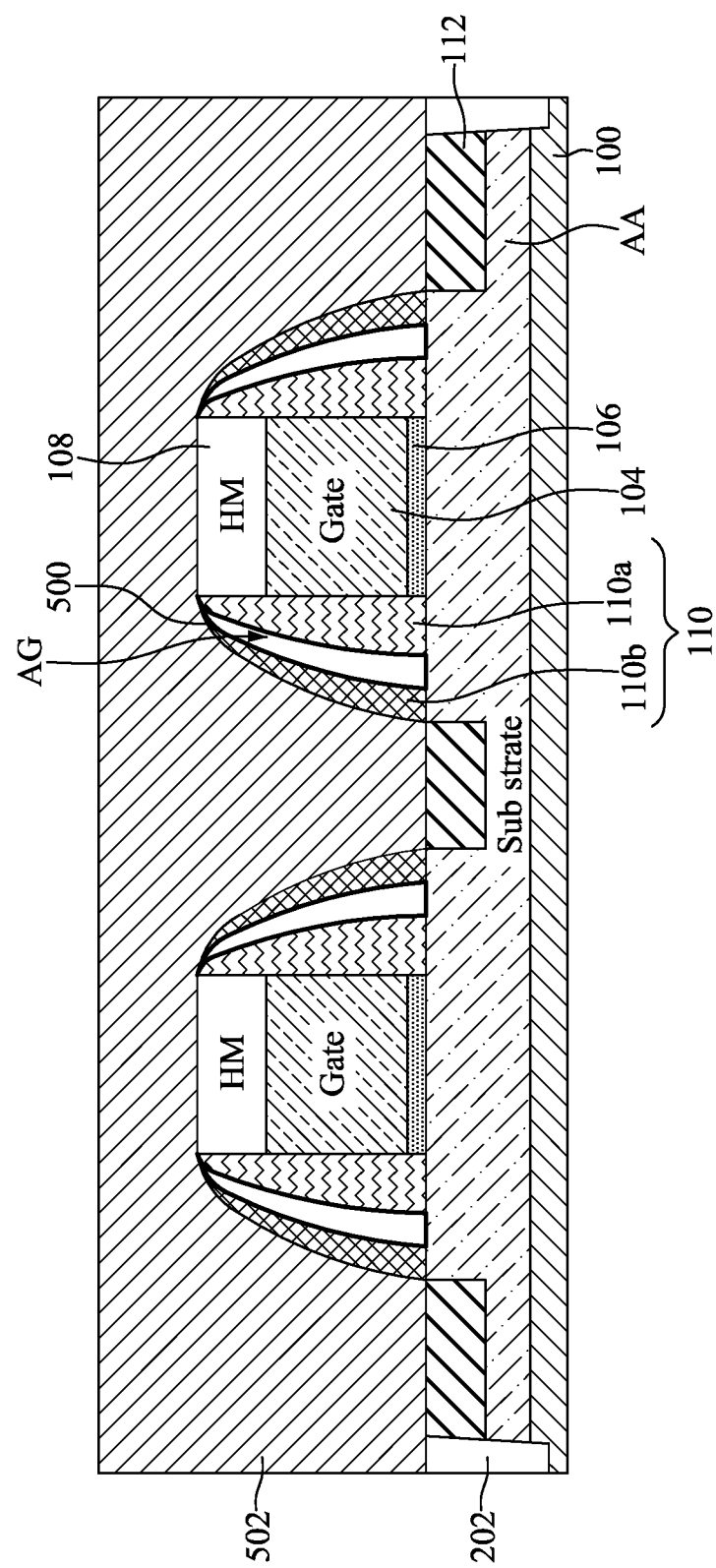

Referring to FIG. 6 and FIG. 7D, step S64 is performed, and a thermal treatment is performed. During the thermal treatment, thermal energy is provided to the sacrificial sidewall spacers 700 formed of the ERM, and the sacrificial sidewall spacers 700 decompose to form the air gaps AG and the liner layers 500 as described with reference to FIG. 5. In some embodiments, the thermal treatment may apply a line of energy on the structure as shown in FIG. 7C, scanning through the structure with the line of energy to deliver the thermal energy to the sacrificial sidewall spacers 700.

Alternatively, a decomposition process of the sacrificial sidewall spacers 700 may be carried out by performing another treatment, as long as sufficient energy can be provided to the sacrificial sidewall spacers 700. For instance, an alternative treatment may include an ultra-violet (UV) light treatment.

Figure 7E:
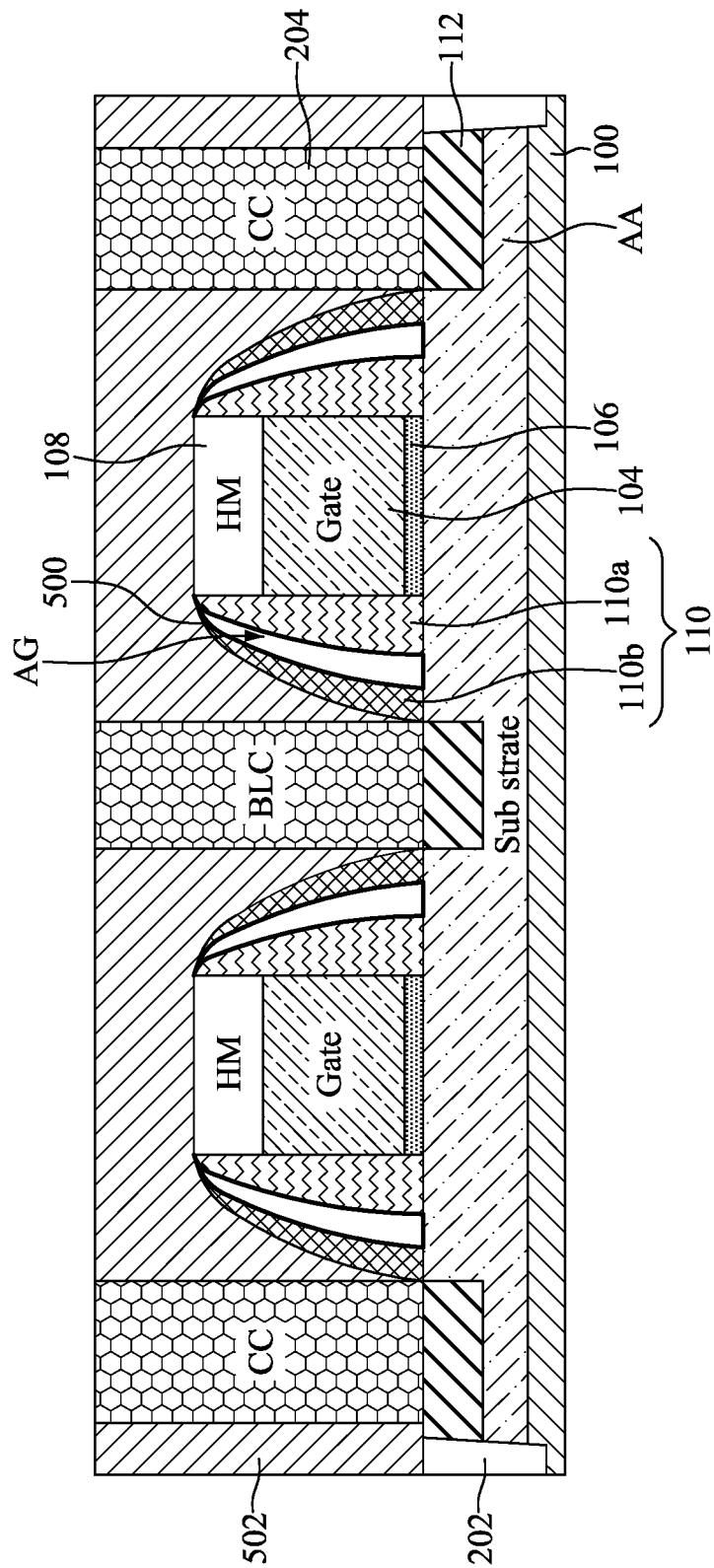

Referring to FIG. 6 and FIG. 7E, step S66 is performed, and the contact plugs 204 are formed in the dielectric layer 502. The contact plugs 204 penetrate through the dielectric layer 502, to establish electrical connection with the source/drain structures 112. In some embodiments, a method for forming the contact plugs 204 includes forming through holes extending through the dielectric layer 502 by a lithography process and an etching process (e.g., an anisotropic etching process). As described with reference to FIG. 4J, the sidewall spacers 110b and the isolation structure 202 may be functioned as masks during the etching process, and size of bottom portions of the through holes may be defined by spacing between adjacent sidewall spacers 110b and spacing between each sidewall spacer 110b and the isolation structure 202. In addition, the contact plugs 204 may or may not in lateral contact with the sidewall spacers 110b. After formation of the through holes, a conductive material may be filled into the through holes by a deposition process (e.g., a PVD process), a plating process or a combination thereof. The conductive material may extend onto a top surface of the dielectric layer 502, and a portion of the conductive material over the top surface of the dielectric layer 502 may be removed by a planarization process. For instance, the planarization process may include a polishing process, an etching process or a combination thereof.

Thereafter, steps S31, S33 as described with reference to FIG. 3, FIG. 4K and FIG. 2 are performed to complete manufacturing of the semiconductor device 50 as shown in FIG. 5. Since a thinning process on a dielectric layer to expose the sacrificial sidewall spacers (e.g., the step S23 as described with reference to FIG. 3 and FIG. 4G), an etching process for removing the sacrificial sidewall spacers (e.g., the step S25 as described with reference to FIG. 3 and FIG. 4H) and a deposition process for sealing the air gaps (e.g., the step S27 as described with reference to FIG. 3 and FIG. 4I) may not be required, the manufacturing of the semiconductor device 50 may be less complicated.

As above, an air gap is sealed between adjacent sidewall spacers laterally surrounding a gate electrode. Due to the low dielectric constant of the air gap, a parasitic capacitance between the gate electrode and a possible conductive component (e.g., a contact plug) aside the gate electrode can be reduced. Accordingly, RC delay on signal transmission through the gate electrode and the possible electrical component aside the gate electrode can be effectively minimized. It should be noted that, in addition to the gate electrode, the sidewall spacers and the air gap sealed in between can be applied to other conductive structure, in order to reduce a parasitic capacitance between this conductive structure and a possible conductive component aside this conductive structure. Therefore, the sidewall spacers and the air gap sealed between may not be limited to the applications of a FET or a DRAM unit cell.

In an aspect of the present disclosure, a semiconductor device is provided. The semiconductor device comprises: a stacking structure, standing on a semiconductor substrate; and a first sidewall spacer and a second sidewall spacer, covering a sidewall of the stacking structure, wherein an air gap is sealed between the first and second sidewall spacers, a top end of the air gap is substantially aligned with top ends of the first and second sidewall spacers, and a top portion of the air gap is tapered toward a top end of the air gap.

In another aspect of the present disclosure, a manufacturing method of a semiconductor device is provided. The method comprises: forming a stacking structure on a semiconductor substrate; forming a first sidewall spacer, a second sidewall spacer and a sacrificial sidewall spacer on a sidewall of the stacking structure, wherein the sacrificial sidewall spacer is located between the first and second sidewall spacers, and the first and second sidewall spacers have an etching selectivity with respect to the sacrificial sidewall spacer; and removing the sacrificial sidewall spacer to form an air gap between the first and second sidewall spacers.

In yet another aspect of the present disclosure, a manufacturing method of a semiconductor device is provided. The method comprises: forming a stacking structure on a semiconductor substrate; forming a first sidewall spacer, a second sidewall spacer and a sacrificial sidewall spacer on a sidewall of the stacking structure, wherein the sacrificial sidewall spacer is located between the first and second sidewall spacers, and the sacrificial sidewall spacer is formed of an energy removable material (ERM); and providing an energy to the sacrificial sidewall spacer, such that the sacrificial sidewall spacer decomposes to form an air gap and a liner layer enclosing the air gap. Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
   a stacking structure, standing on a semiconductor substrate; and
   a first sidewall spacer and a second sidewall spacer, covering a sidewall of the stacking structure, wherein an air gap is sealed between the first and second sidewall spacers, topmost ends of the first sidewall spacer, the air gap, the second sidewall spacer and the stacking structure are coplanara, and a top portion of the air gap is tapered toward the topmost end of the air gap.

2. The semiconductor device according to claim 1, wherein the air gap is substantially identical with the first and second sidewall spacers in terms of shape.

3. The semiconductor device according to claim 1, wherein the air gap laterally spans from an outer sidewall of the first sidewall spacer to an inner sidewall of the second sidewall spacer.

4. The semiconductor device according to claim 1, wherein the first and second sidewall spacers are respectively formed of a carbon-containing material.

5. The semiconductor device according to claim 4, wherein the carbon-containing material comprises high density carbon (HDC), silicon carbide or silicon carbonitride.

6. The semiconductor device according to claim 1, further comprising a liner layer enclosing the air gap.

7. The semiconductor device according to claim 6, wherein the liner layer covers opposing sidewalls of the first and second sidewall spacers as well as a portion of the semiconductor substrate between the first and second sidewall spacers, and seals the top end of the air gap.

8. The semiconductor device according to claim 1, wherein the stacking structure comprises:
   a gate electrode, disposed over the semiconductor substrate; and
   a gate dielectric layer, lying between the gate electrode and the semiconductor substrate.

9. The semiconductor device according to claim 8, wherein the stacking structure further comprises a hard mask disposed on the gate electrode.

10. The semiconductor device according to claim 8, further comprising:
    source/drain structures, disposed in a surface region of the semiconductor substrate and located at opposite sides of the stacking structure; and
    contact plugs, respectively standing on one of the source/drain structures, and electrically connected to the source/drain structures.

11. The semiconductor device according to claim 10, wherein the contact plugs are laterally spaced apart from the stacking structure by the first and second sidewall spacers as well as the air gap.

\* \* \* \* \*